US012805402B2

(12) United States Patent
Kim

(10) Patent No.: US 12,805,402 B2
(45) Date of Patent: Nov. 17, 2026

(54) SEMICONDUCTOR DEVICE AND METHOD OF MANUFACTURING THE SAME

(71) Applicant: PICO SEMICONDUCTOR INC., Suwon-si (KR)

(72) Inventor: Yong Kuk Kim, Suwon-si (KR)

(73) Assignee: PICO SEMICONDUCTOR INC., Suwon-si (KR)

( * ) Notice: Subject to any disclaimer, the term of this patent is extended or adjusted under 35 U.S.C. 154(b) by 417 days.

(21) Appl. No.: 18/480,516

(22) Filed: Oct. 4, 2023

(65) Prior Publication Data

US 2025/0079416 A1 Mar. 6, 2025

(30) Foreign Application Priority Data

Aug. 29, 2023 (KR) ........................ 10-2023-0113375

(51) Int. Cl.
*H10W 90/00* (2026.01)
*H10D 1/68* (2025.01)
(Continued)

(52) U.S. Cl.
CPC .............. *H10W 90/00* (2026.01); *H10D 1/68* (2025.01); *H10W 20/40* (2026.01); *H10W 70/05* (2026.01);
(Continued)

(58) Field of Classification Search
CPC ..... H10W 90/00; H10W 20/40; H10W 70/05; H10W 74/01; H10W 72/01257; H10W 72/072; H10W 72/223; H10W 72/241; H10W 72/252; H10W 80/312; H10W 90/724; H10W 90/798; H10W 20/496; H10W 74/129; H10W 72/90;
(Continued)

(56) References Cited

U.S. PATENT DOCUMENTS

| | | | | |
|---|---|---|---|---|
| 2014/0225223 A1* | 8/2014 | Zhu | H10D 1/68 | 257/532 |
| 2016/0268234 A1* | 9/2016 | Lin | H10W 70/09 | |
| 2017/0098589 A1* | 4/2017 | Liu | H10W 46/00 | |
| 2017/0287853 A1 | 10/2017 | Kim et al. | | |
| 2018/0102313 A1 | 4/2018 | Shih | | |
| 2019/0392992 A1 | 12/2019 | Kumagae et al. | | |

FOREIGN PATENT DOCUMENTS

| | | |
|---|---|---|
| JP | 2008-227266 A | 9/2008 |
| JP | 2013-165157 A | 8/2013 |

(Continued)

OTHER PUBLICATIONS

Machine Translation of KR-20080068983 (Year: 2008).*
(Continued)

*Primary Examiner* — Julia Slutsker
(74) *Attorney, Agent, or Firm* — AJU IP Global PLLC

(57) ABSTRACT

Provided are a semiconductor device and a method of manufacturing the same. The semiconductor device includes a semiconductor chip in which a bonding pad is formed in a wafer state, a first passivation layer formed on the semiconductor chip to expose the bonding pad, a first re-distribution layer connected to the bonding pad and extending on the first passivation layer, a conductive bump disposed on an electrical signal path leading to the bonding pad, the first re-distribution layer, and a substrate, and a capacitor formed to be electrically connected to the first re-distribution layer at a wafer level before the conductive bump is formed.

5 Claims, 35 Drawing Sheets

(51) Int. Cl.

| | |
|---|---|
| ***H10W 20/40*** | (2026.01) |
| ***H10W 70/05*** | (2026.01) |
| ***H10W 72/00*** | (2026.01) |
| ***H10W 72/20*** | (2026.01) |
| ***H10W 74/01*** | (2026.01) |
| ***H10W 80/00*** | (2026.01) |

(52) U.S. Cl.
CPC ......... *H10W 72/252* (2026.01); *H10W 74/01* (2026.01); *H10W 72/01257* (2026.01); *H10W 72/072* (2026.01); *H10W 72/223* (2026.01); *H10W 72/241* (2026.01); *H10W 80/312* (2026.01); *H10W 90/724* (2026.01); *H10W 90/798* (2026.01)

(58) Field of Classification Search
CPC . H10W 95/00; H10W 44/601; H10W 72/019; H10W 70/60; H10W 72/07236; H10W 72/00; H10W 72/20; H10W 74/13; H10D 1/68; H10P 54/00
See application file for complete search history.

(56) References Cited

FOREIGN PATENT DOCUMENTS

| | | | | | |
|---|---|---|---|---|---|
| JP | 2017-188645 | A | | 10/2017 | |
| KR | 20080068983 | A | * | 7/2008 | .............. E03F 5/105 |
| KR | 10-2017-0112907 | A | | 10/2017 | |
| TW | 201735130 | A | | 10/2017 | |
| TW | 201735295 | A | | 10/2017 | |
| TW | 202201574 | A | | 1/2022 | |
| TW | 202232692 | A | | 8/2022 | |
| TW | 202310281 | A | | 3/2023 | |
| WO | 2017/195639 | A1 | | 11/2017 | |

OTHER PUBLICATIONS

Office Action issued on Jan. 7, 2025 in the corresponding Japanese Patent Application No. 2023-173513.

Office Action issued on May 21, 2024 in Taiwanese Patent Application No. 112140479.

* cited by examiner

<PCB-embedded Capacitor>

S135A

S150

S135F

SEMICONDUCTOR DEVICE AND METHOD OF MANUFACTURING THE SAME

CROSS-REFERENCE TO RELATED APPLICATION

This application claims the benefit under 35 USC § 119 (a) of Korean Patent Application No. 10-2023-0113375, filed on Aug. 29, 2023, in the Korean Intellectual Property Office, the entire disclosures of which is hereby incorporated by reference for all purposes.

BACKGROUND

1. Field

The following description relates to a semiconductor device and a method of manufacturing the same, and more specifically, to a semiconductor device, such as a wafer-level package (WLP) or wafer-level chip-scale package (WLCSP), and a method of manufacturing the same.

2. Discussion of Related Art

With a decrease in operating voltages of semiconductor integrated circuits (ICs) and an increase in operating frequencies, it is required to reduce power noise to ensure normal operation of the semiconductor ICs. To reduce power noise by lowering the impedance of a power delivery network (PDN) from an external substrate (e.g., a multi-layer printed circuit board (PCB)) to a power input pad of a semiconductor IC or a PDN from an output pad of the semiconductor IC to an application connection, a decoupling capacitor with low equivalent serial resistance (ESR) and low equivalent serial inductance (ESL) is used. As such a decoupling capacitor, a multi-layer ceramic capacitor, a low-inductance ceramic capacitor, or a three-dimensional (3D) silicon capacitor is used.

To minimize the impedance of a PDN, a decoupling capacitor is generally disposed near an input node (input pad), a power node (power pad), or an output node (output pad). In other words, as shown in the examples of FIG. 1, a decoupling capacitor is disposed to minimize a length A as much as possible.

FIG. 2 is a set of diagrams illustrating structures in which a decoupling capacitor is disposed according to the related art. FIG. 2A shows a structure in which a decoupling capacitor DCAP is disposed on a side to which a packaged semiconductor chip DIE is attached between the two sides of a multi-layer PCB substrate (die side capacitor). FIG. 2B shows a structure in which a decoupling capacitor DCAP is disposed in a multi-layer PCB substrate (i.e., one of multiple layers of the multi-layer PCB substrate) (PCB-embedded capacitor). FIG. 2C shows a structure in which a decoupling capacitor DCAP is disposed on a side to which a packaged semiconductor chip DIE is not attached between the two sides of a multi-layer PCB substrate (land side capacitor).

All the PDNs between the semiconductor chips DIE and the die side capacitor, the PCB-embedded capacitor, and the land side capacitor are present in the multi-layer PCB substrates of FIG. 2. Accordingly, the impedance of the PDNs increases due to influence of interconnections of the multi-layer PCB substrates, and the impedance of bumps of the semiconductor chips DIE manufactured with a conductive material are also influenced, limiting a reduction in power noise applied to the semiconductor chips DIE. Further, the resistance of the PDNs is a factor that causes voltages applied to the semiconductor chips DIE to drop.

SUMMARY

The present invention is directed to providing a semiconductor device having an improved impedance characteristic and power noise reduction characteristic compared to the related art.

According to an aspect of the present invention, there is provided a semiconductor device including a semiconductor chip in which a bonding pad is formed in a wafer state, a first passivation layer formed on the semiconductor chip to expose the bonding pad, a first re-distribution layer connected to the bonding pad and extending on the first passivation layer, a conductive bump disposed on an electrical signal path leading to the bonding pad, the first re-distribution layer, and a substrate, and a capacitor formed to be electrically connected to the first re-distribution layer at a wafer level before the conductive bump is formed.

According to another aspect of the present invention, there is provided a method of manufacturing a semiconductor device, the method including forming a first passivation layer on a semiconductor chip to expose a bonding pad formed in the semiconductor chip, forming a first re-distribution layer connected to the bonding pad and extending on the first passivation layer, forming a capacitor to be electrically connected to the first re-distribution layer at a wafer level, and forming a conductive bump on an electrical signal path leading to the bonding pad, the first re-distribution layer, and a substrate after the capacitor is formed.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

Figure 1:
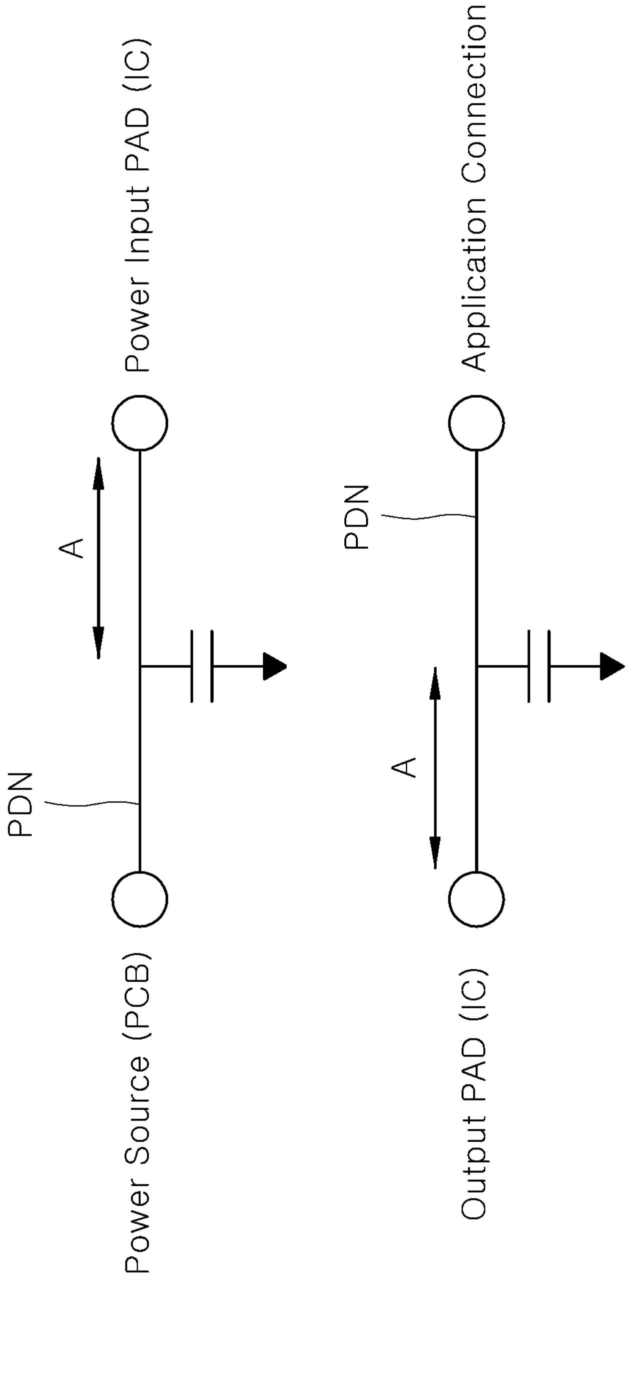
FIG. 1 is a set of diagrams illustrating power delivery networks (PDNs) of a semiconductor integrated circuit (IC) according to the related art.
Figure 2A:
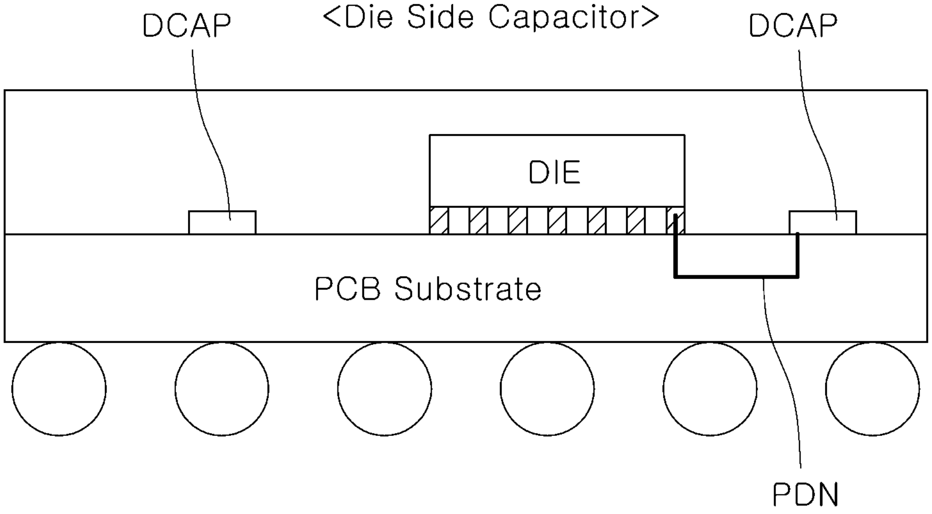
FIGS. 2A to 2C are diagrams illustrating structures in which a decoupling capacitor is disposed according to the related art.
Figure 2B:
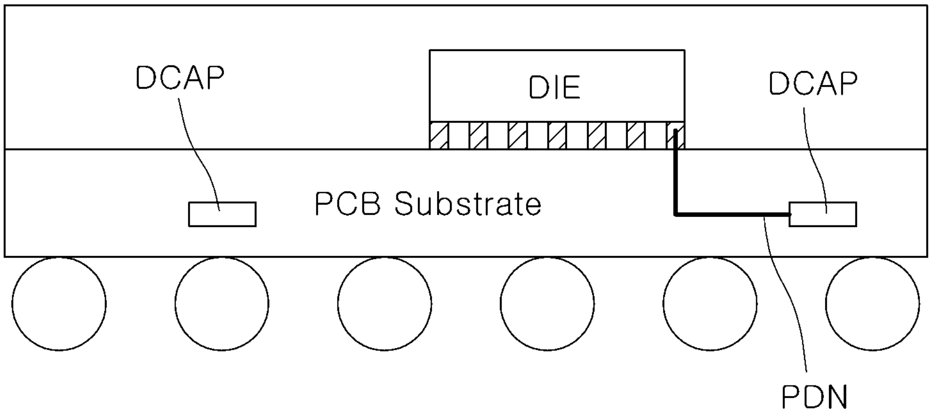
Figure 2C:
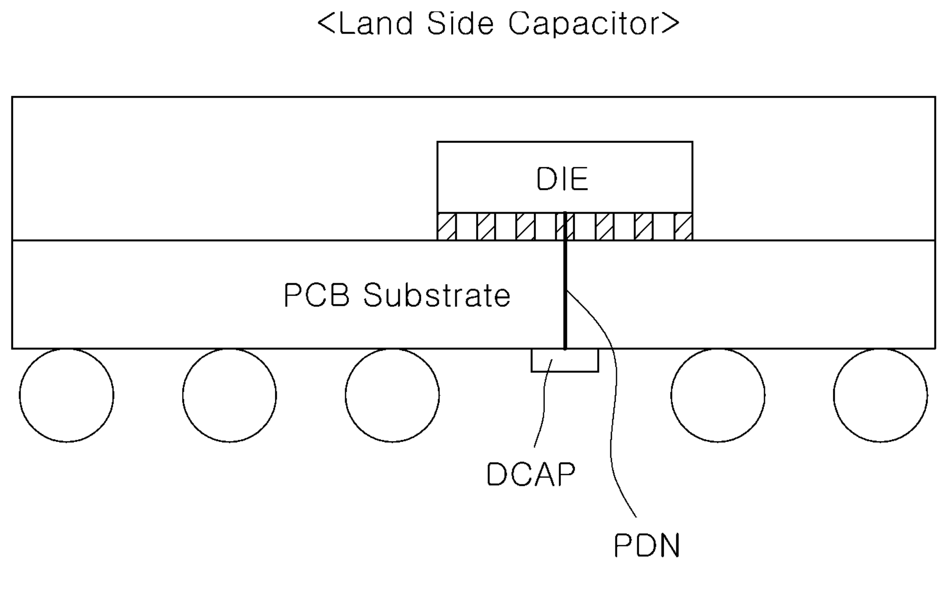

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience

DETAILED DESCRIPTION OF EXEMPLARY EMBODIMENTS

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Advantages and features of the present disclosure and methods of achieving the advantages and features will be clear with reference to embodiments described in detail below together with the accompanying drawings. However, the present disclosure is not limited to the embodiments disclosed herein but will be implemented in various forms. The embodiments of the present disclosure are provided so that the present disclosure is completely disclosed, and a person with ordinary skill in the art can fully understand the scope of the present disclosure. The present disclosure will be defined only by the scope of the appended claims.

Meanwhile, the terms used in the present specification are for explaining the embodiments, not for limiting the present disclosure.

Terms, such as first, second, A, B, (a), (b) or the like, may be used herein to describe components. Each of these terminologies is not used to define an essence, order or sequence of a corresponding component but used merely to distinguish the corresponding component from other component(s). For example, a first component may be referred to as a second component, and similarly the second component may also be referred to as the first component.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween.

The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 3:
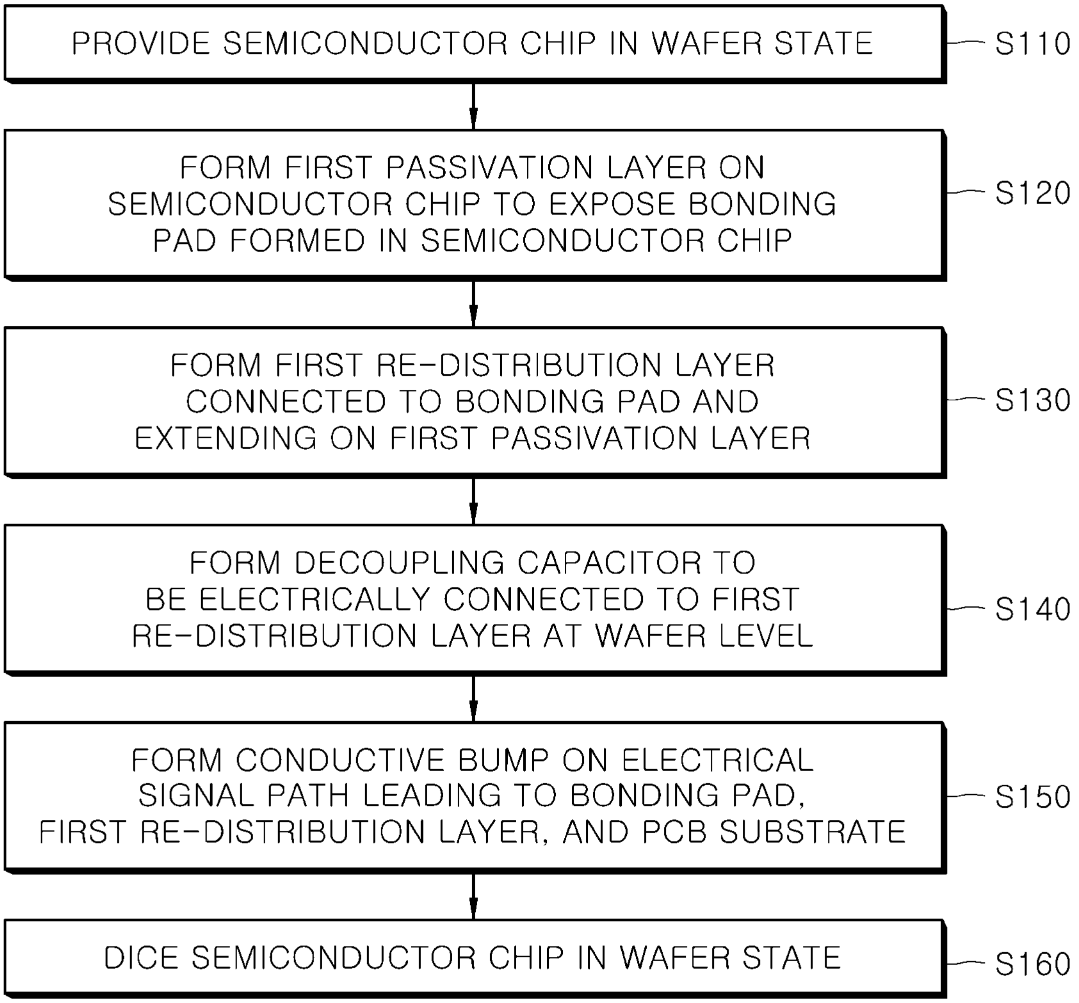
FIG. 3 is a flowchart illustrating a method of manufacturing a semiconductor device according to an exemplary embodiment of the present invention.

FIG. 3 is a flowchart illustrating a method of manufacturing a semiconductor device according to an exemplary embodiment of the present invention.

Referring to FIG. 3, the method of manufacturing a semiconductor device according to this exemplary embodiment may include an operation S110 of preparing a semiconductor chip 10 in which a bonding pad BP is formed in a wafer state, an operation S120 of forming a first passivation layer 20 on the semiconductor chip 10 to expose the bonding pad BP formed in the semiconductor chip 10, an operation S130 of forming a first re-distribution layer 30 connected to the bonding pad BP and extending on the first passivation layer 20, an operation S140 of forming a capacitor DCAP to be electrically connected to the first re-distribution layer 30 at a wafer level, an operation S150 of forming a conductive bump B on an electrical signal path leading to the bonding pad BP, the first re-distribution layer 30, and a printed circuit board (PCB) substrate after the capacitor DCAP is formed, and an operation S160 of dicing the semiconductor chip 10 in the wafer state after the conductive bump P is formed. The capacitor DCAP may be a decoupling capacitor (e.g., a multilayer ceramic capacitor (MLCC), a low inductance ceramic capacitor (LICC), or a three-dimensional (3D) capacitor) configured to lower the impedance of an electrical signal connected to the bonding pad BP, the first re-distribution layer 30, and the PCB substrate.

A wafer-level package (WLP) may be manufactured through the operations S110 to S150, and a plurality of chip-scale packages (CSPs) may be manufactured through a process of dicing the WLP in the operation S160. Accordingly, a semiconductor device to be manufactured in the present invention may be a WLP or a CSP.

The present invention proposes three manufacturing processes depending on design specifications of a semiconductor device to be manufactured according to three embodiments. A method of manufacturing a semiconductor device according to each embodiment will be described in detail below.

1. First Exemplary Embodiment

FIGS. 4A to 4H are cross-sectional views illustrating each operation of a method of manufacturing a semiconductor device according to a first exemplary embodiment of the present invention.

Figure 4A:
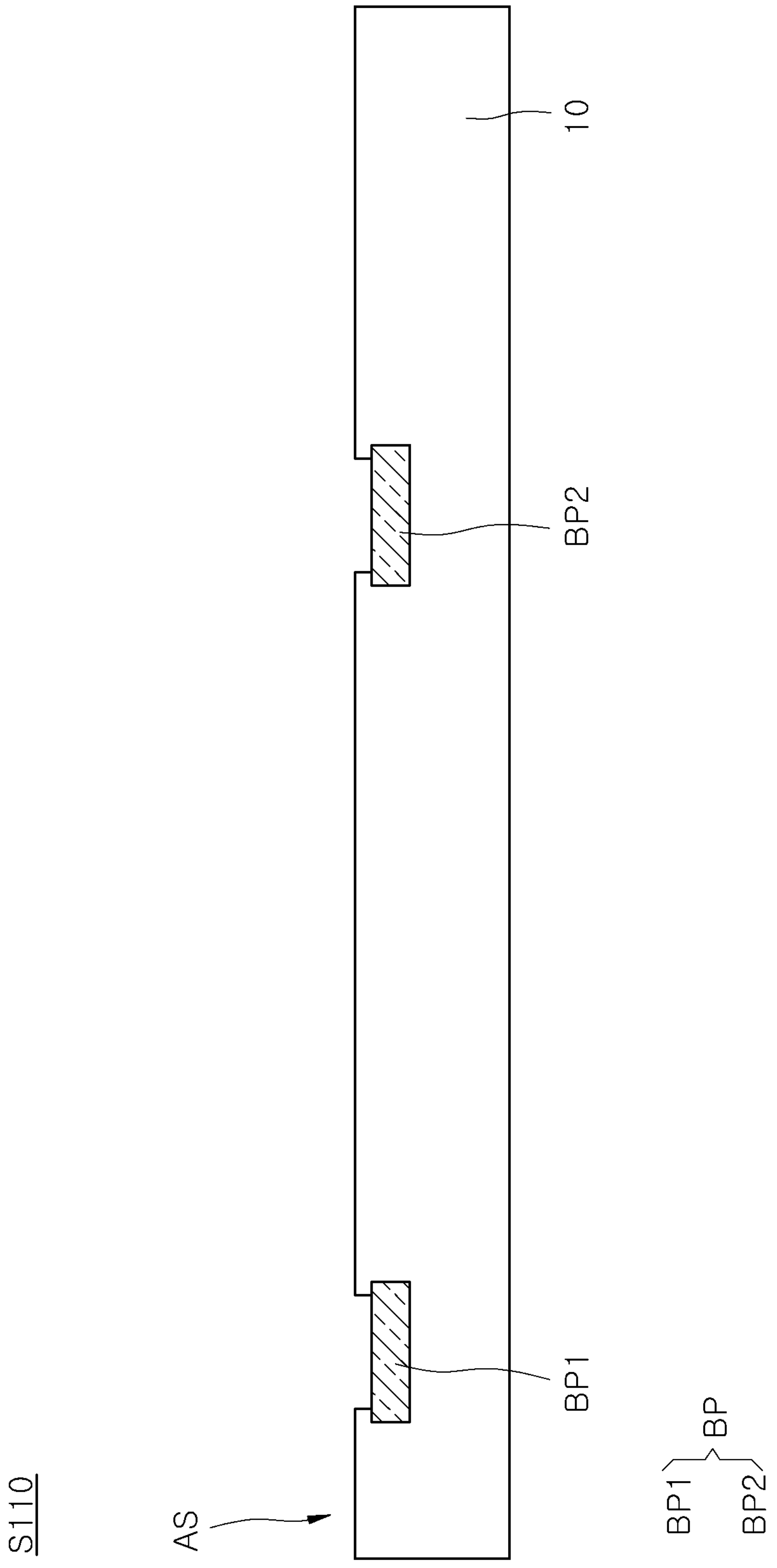
FIGS. 4A to 4H are cross-sectional views illustrating each operation of a method of manufacturing a semiconductor device according to a first exemplary embodiment of the present invention.

Referring to FIG. 4A, first, a semiconductor chip 10 in which a predesigned circuit is integrated in a wafer state is provided (S110). In this embodiment, the semiconductor chip 10 is a chip manufactured in a fabrication facility (FAB), and thus is defined as including a die passivation layer (not shown) for protecting the circuit integrated in the semiconductor chip 10 (the die passivation layer may be implemented using silicon dioxide ($SiO_2$), silicon nitride (SiN), or a stacked structure of silicon dioxide and silicon nitride). In the semiconductor chip 10, a plurality of bonding pads BP which are paths for power supply and electrical input and output of the circuit are formed to be exposed on the side of an active surface AS of the semiconductor chip 10 through pad openings. The die passivation layer is formed to expose the bonding pads BP on the side of the active surface AS. As shown in FIG. 4A, bonding pads on which this embodiment focuses among the plurality of bonding pads BP formed in the semiconductor chip 10 are defined to be first and second bonding pads BP1 and BP2. For example, the first bonding pad BP1 may be a pad for input of power (e.g., VCC), and the second bonding pad BP2 may be a pad for input of ground GND.

Figure 4B:
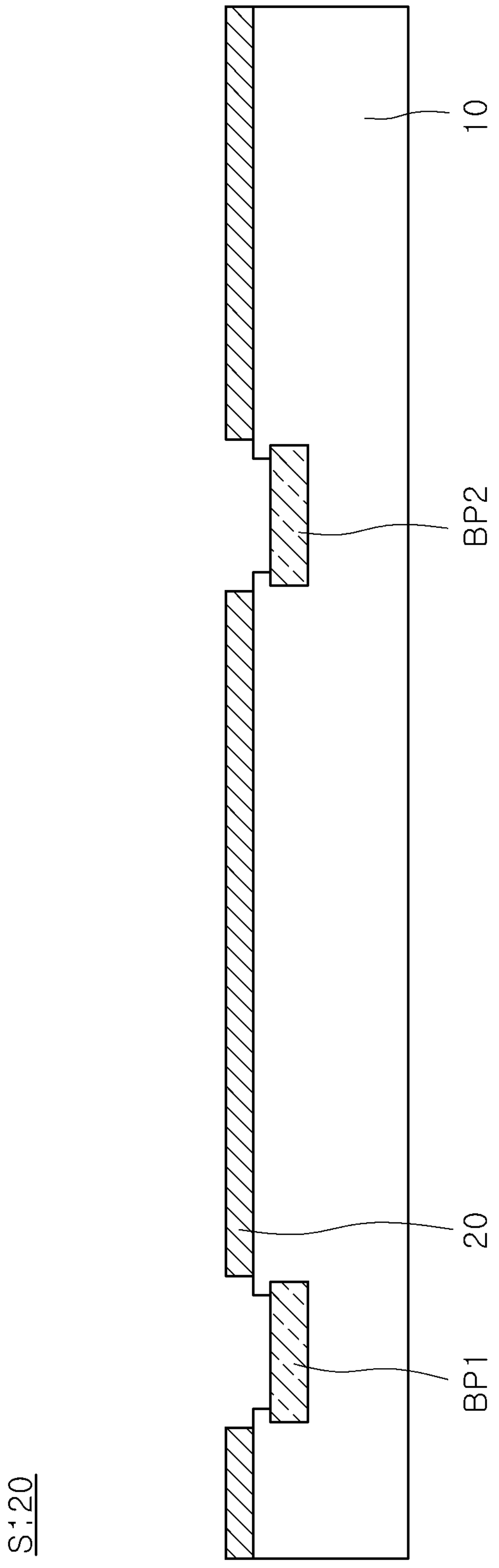

Subsequently, as shown in FIG. 4B, a first passivation layer 20 is formed on the semiconductor chip 10 to expose the bonding pads BP (S120). In the operation S120, the first passivation layer 20 is formed on the active surface AS of the semiconductor chip 10, and the active surface AS of the semiconductor chip 10 is coated with photoresist excluding regions in which the bonding pads BP are formed (all or some of the regions in which the bonding pads BP are formed). After that, the photoresist is exposed and developed to expose the bonding pads BP on the side of the active surface AS of the semiconductor chip 10. The first passivation layer 20 may be implemented using a photosensitive polymer or polyimide material (this is the same for second and third passivation layers 40 and 60 to be described below).

Figure 4C:
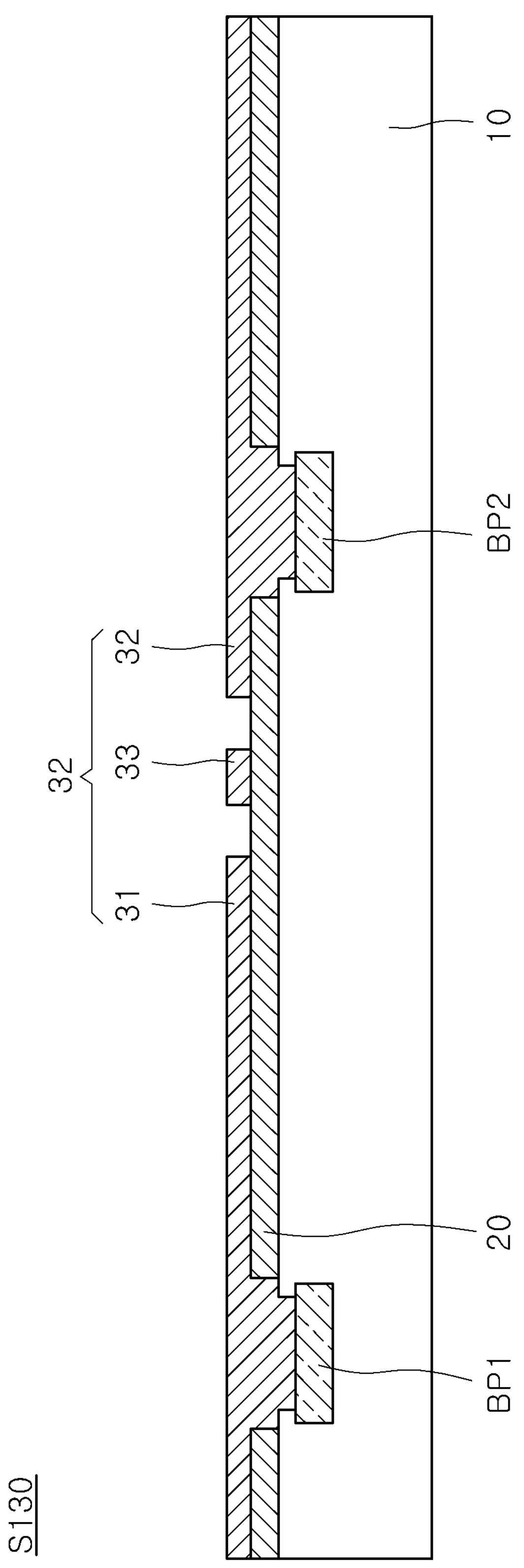

Subsequently, as shown in FIG. 4C, a first re-distribution layer 30 is formed to be connected to the bonding pads BP and extend on the first passivation layer 20 (S130). In other words, the first re-distribution layer 30 is formed to be connected to the bonding pads BP through the regions in which the bonding pads BP are exposed through the first passivation layer 20, and extend on the first passivation layer 20. The first re-distribution layer 30 functions as a layer for rearranging the bonding pads BP and may be implemented using a conductive material such as copper (Cu). As is well known, the first re-distribution layer 30 having a target layout may be formed through a seed layer forming process, an electroplating process, and a seed layer etching process. As shown in FIG. 4C, a part of the first re-distribution layer 30 connected to the first bonding pad BP1 is defined to be a first re-distribution line 31, and a part of the first re-distribution layer 30 connected to the second bonding pad BP2 is defined to be a second re-distribution line 32. Also, as shown in FIG. 4C, an additional re-distribution line 33 for rearranging an additional bonding pad (not shown) may be formed in the operation S130.

Figure 4D:
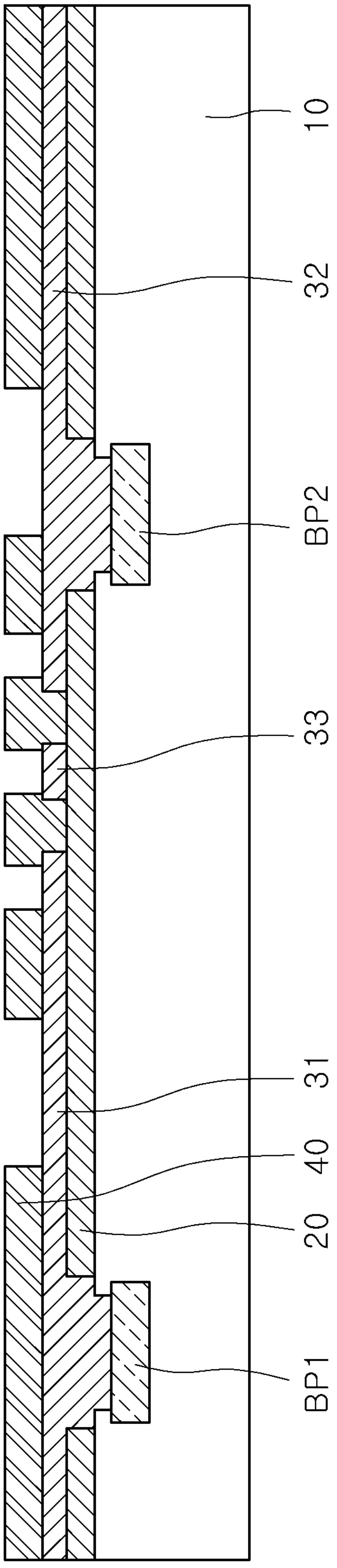

Subsequently, as shown in FIG. 4D, the second passivation layer 40 is formed on the first passivation layer 20 and the first re-distribution layer 30 to expose at least a part of the first re-distribution layer 30 (S135A). In the operation S135A, the second passivation layer 40 is formed to cover the first passivation layer 20 and the first re-distribution layer 30, the entire region other than a region in which a conductive member 70 to be described below will be formed is coated with photoresist, and then the photoresist is exposed and developed to expose at least a part of the first re-distribution layer 30 on the side of the active surface AS of the semiconductor chip 10.

Figure 4E:
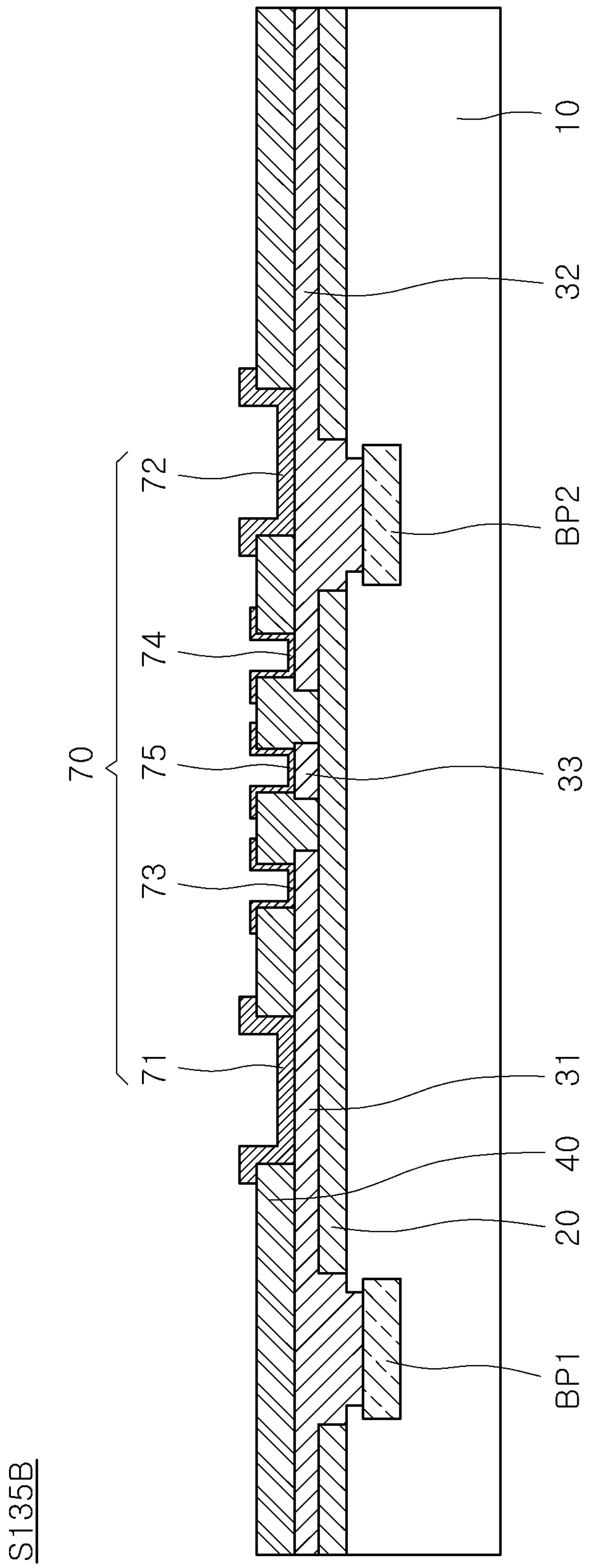

Subsequently, as shown in FIG. 4E, the conductive member 70 is formed through a plating process in the region in which the first re-distribution layer 30 is exposed through the second passivation layer 40 (S135B). The conductive member 70 may be an under-bump metal (UBM) provided to facilitate welding of a conductive bump B and a capacitor DCAP to be described below. To clearly distinguish terms, a conductive member on which a first conductive bump B1 to be described below is formed is defined as a first conductive member 71, a conductive member on which a second conductive bump B2 is formed is defined as a second conductive member 72, a conductive member to which a first power input pad of the capacitor DCAP to be described below is connected is defined as a third conductive member 73, and a conductive member to which a second power input pad of the capacitor DCAP is connected is defined as a fourth conductive member 74. The first conductive member 71 and the third conductive member 73 are electrically connected through the first re-distribution line 31, and the second conductive member 72 and the fourth conductive member 74 are electrically connected through the second re-distribution line 32. An additional conductive member 75 may also be formed on the additional re-distribution line 33 described above. The first and second conductive members 71 and 72 and the third, fourth and additional conductive members 73, 74, and 75 may be formed through the same process in the operation S135B. However, the first and second conductive members 71 and 72 may have different physical features (e.g., thickness) from the third, fourth and additional conductive members 73, 74, and 75. The first and second conductive members 71 and 72 may have the same physical features, and the third, fourth and additional conductive members 73, 74, and 75 may have the same physical features (this is the same in a third exemplary embodiment to be described below).

Figure 4F:
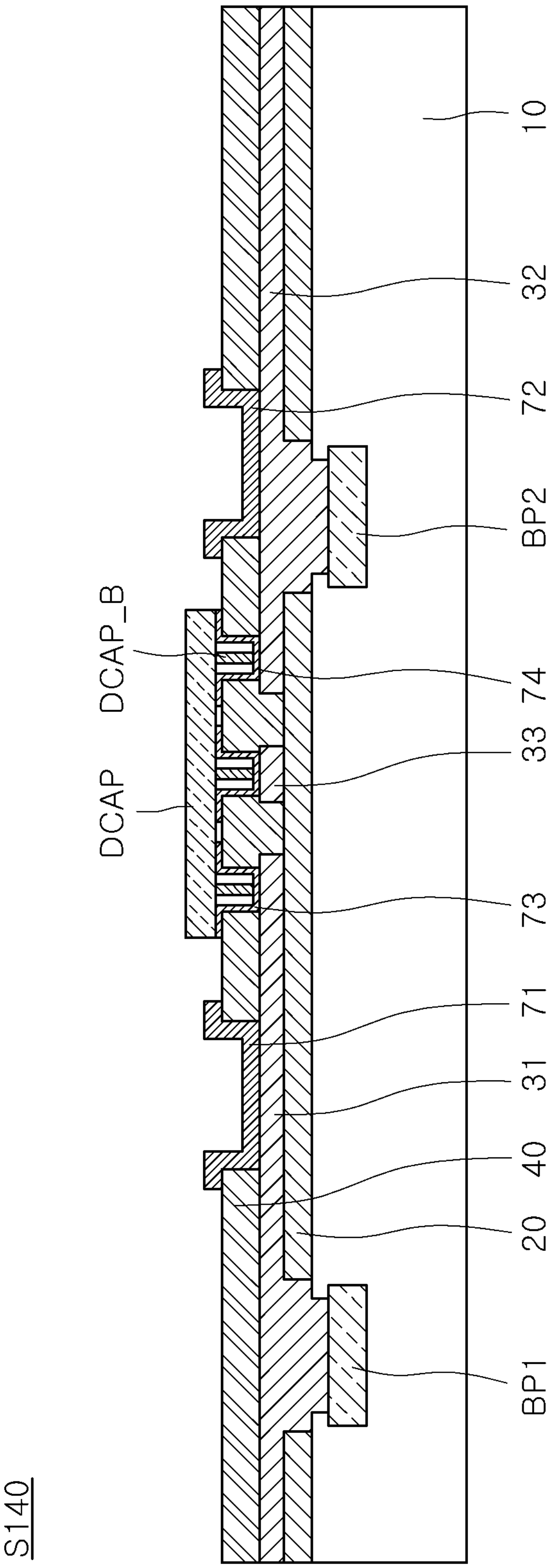

Subsequently, as shown in FIG. 4F, the capacitor DCAP is formed to be electrically connected to the first re-distribution layer 30 at a wafer level (S140). The term "at a wafer level" means that the capacitor DCAP is formed in a WLP rather than a PCB substrate to which the packaged semiconductor chip 10 of this embodiment is attached. The capacitor DCAP may have a plurality of power input pads, for example, a first power input pad (e.g., a VCC pad) and a second pad (e.g., a GND pad). Accordingly, in the operation S140, the capacitor DCAP is mounted on the semiconductor chip 10 to bring a solder cap of a bump (e.g., a copper pillar bump) DCAP_B formed on the first power input pad of the capacitor DCAP into contact with the third conductive member 73 electrically connected to the first re-distribution line 31 and bring a solder cap of a bump (e.g., a copper pillar bump) DCAP_B formed on the second power input pad of the capacitor DCAP into contact with the fourth conductive member 74 electrically connected to the second re-distribution line 32, and then a reflow process is performed to weld the capacitor DCAP to the third and fourth conductive members 73 and 74. When the capacitor DCAP has an additional power input pad, the additional power input pad of the capacitor DCAP may be formed in contact with the additional conductive member 75 electrically connected to the additional re-distribution line 33 described above. In this way, the first and second re-distribution lines 31 and 32 and the additional re-distribution line 33 are configured to function as multi-nodes of the capacitor DCAP.

Figure 4G:
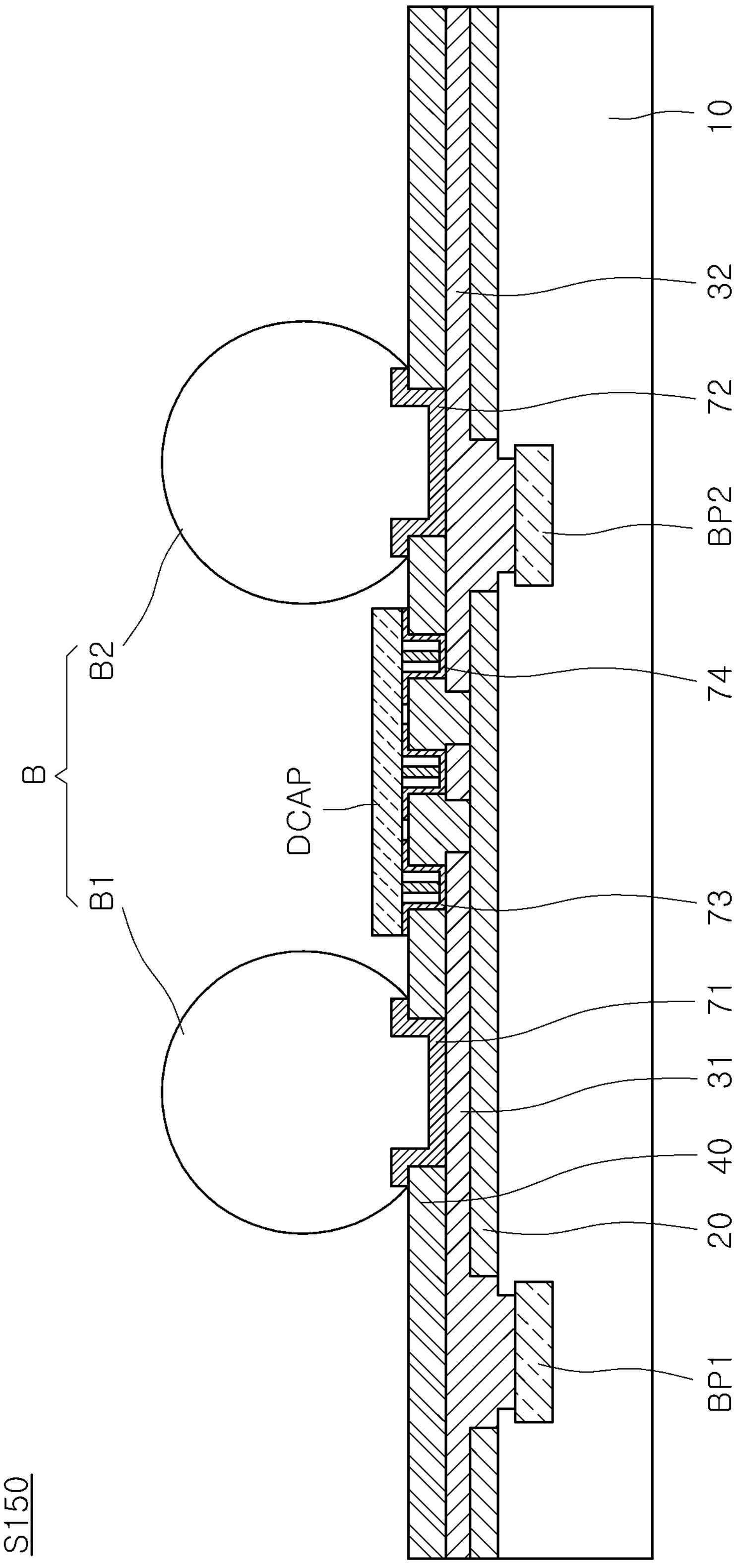

Subsequently, as shown in FIG. 4G, a conductive bump B is formed on an electrical signal path leading to the bonding pads BP, the first re-distribution layer 30, and the PCB substrate (not shown) to which the packaged semiconductor chip 10 (i.e., a WLP) will be attached (S150). When an electrical signal path leading to the first bonding pad BP1, the first re-distribution line 31, the first conductive member 71, and the PCB substrate is defined as a first electrical signal path and an electrical signal path leading to the second bonding pad BP2, the second re-distribution line 32, the second conductive member 72, and the PCB substrate is defined as a second electrical signal path, the conductive bump B may include a first conductive bump B1 disposed on the first electrical signal path and a second conductive bump B2 disposed on the second electrical signal path. Accordingly, in the operation S150, the first and second conductive bumps B1 and B2 are mounted on the semiconductor chip 10 to bring the first conductive bump B1 into contact with the first conductive member 71 electrically connected to the first re-distribution line 31 and bring the second conductive bump B2 into contact with the second conductive member 72 electrically connected to the second re-distribution line 32, and then a reflow process is performed to weld the first and second conductive bumps B1 and B2 to the first and second conductive members 71 and 72, respectively.

Meanwhile, the drawings of this embodiment show a structure in which the first re-distribution line 31 is electrically connected to the first conductive bump B1 and the second re-distribution line 32 is electrically connected to the second conductive bump B2, but another conductive bump (a plurality of conductive bumps) may be provided in this embodiment in addition to the first and second conductive bumps B1 and B2. Accordingly, the first re-distribution line 31 or the second re-distribution line 32 may be configured to be electrically connected to the additional conductive bump other than the first conductive bump B1 or the second conductive bump B2.

Figure 4H:
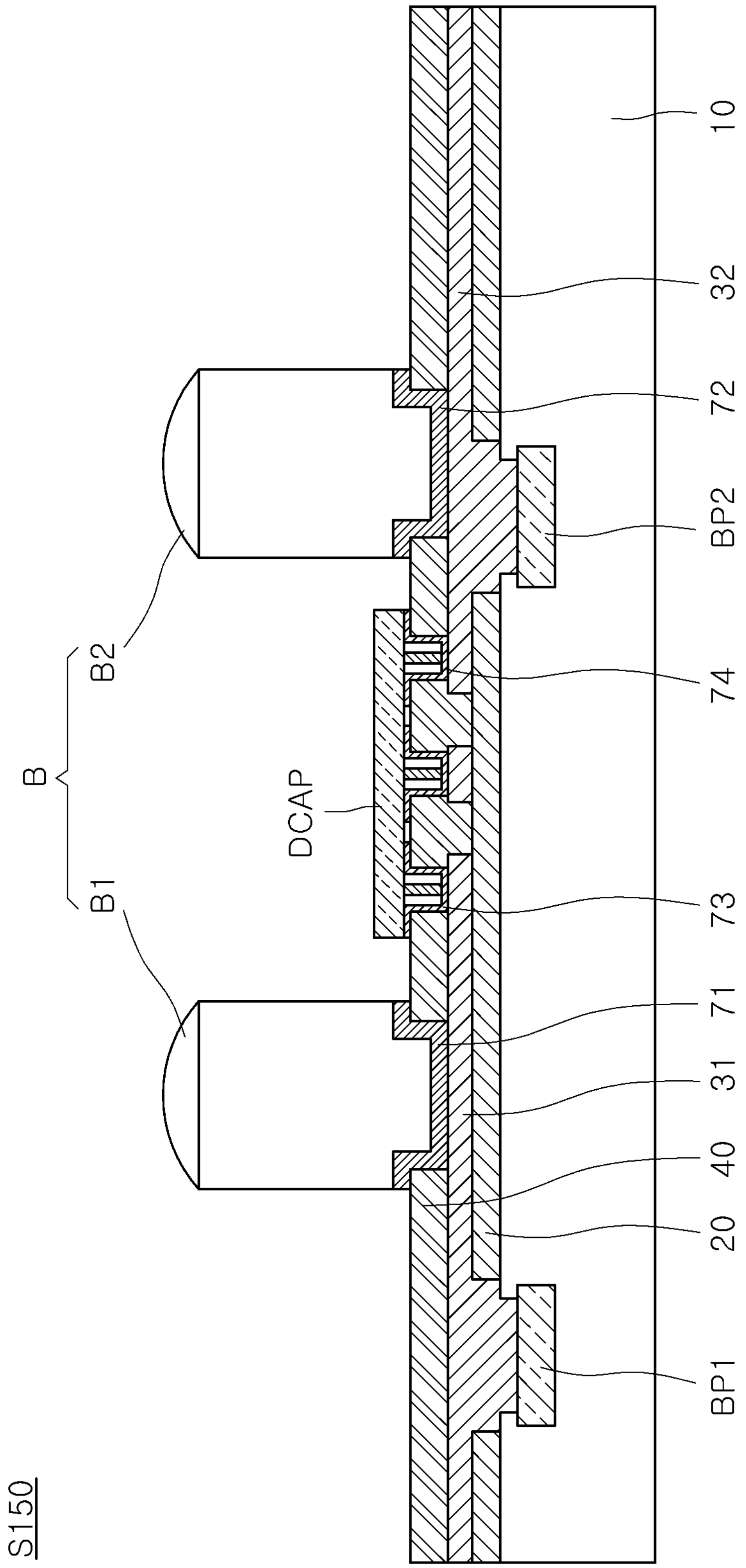

Although FIG. 4G shows an example in which the conductive bump B is implemented as a solder bump, the conductive bump B may be implemented as a copper pillar bump as shown in FIG. 4H according to an embodiment. In other words, when the semiconductor chip 10 has high power consumption and requires a high operating voltage and a small number of input and output pads, it is preferable to apply a solder bump with relatively large size, and when the semiconductor chip 10 has low power consumption and requires a low operating voltage and a large number of input and output pads, it is preferable to apply a copper pillar bump with relatively small size.

A WLP (particularly, a fan-in WLP) can be manufactured through the operations S110 to S150. In particular, the capacitor DCAP is electrically connected to the first electrical signal path (e.g., a VCC power input path) and the second electrical signal path (e.g., a ground path) through the first re-distribution layer 30 to lower the impedance of the first and second electrical signal paths. Accordingly, it is possible to obtain an improved impedance characteristic and power noise reduction characteristic.

Meanwhile, after the operation S150, an operation S160 of dicing the semiconductor chip 10 in the wafer state into a plurality of CSPs may be additionally performed.

2. Second Exemplary Embodiment

FIGS. 5A to 5J are cross-sectional views illustrating each operation of a method of manufacturing a semiconductor device according to a second exemplary embodiment of the present invention.

In a process of manufacturing a WLP, a plurality of re-distribution layers may be required for rearranging pads in accordance with the number of pads and the total layout area of a semiconductor chip 10. The second exemplary embodiment focuses on a structure in which a capacitor DCAP is formed in a passivation layer and a process of forming the capacitor DCAP in the passivation layer when a WLP is configured to include a plurality of re-distribution layers. Detailed description of the same structure and process as those of the first exemplary embodiment will be omitted, and a different structure and process from the first exemplary embodiment will be described. The same process and structure as those of the first exemplary embodiment will be indicated by the same reference numerals as those of the first exemplary embodiment.

Figure 5A:
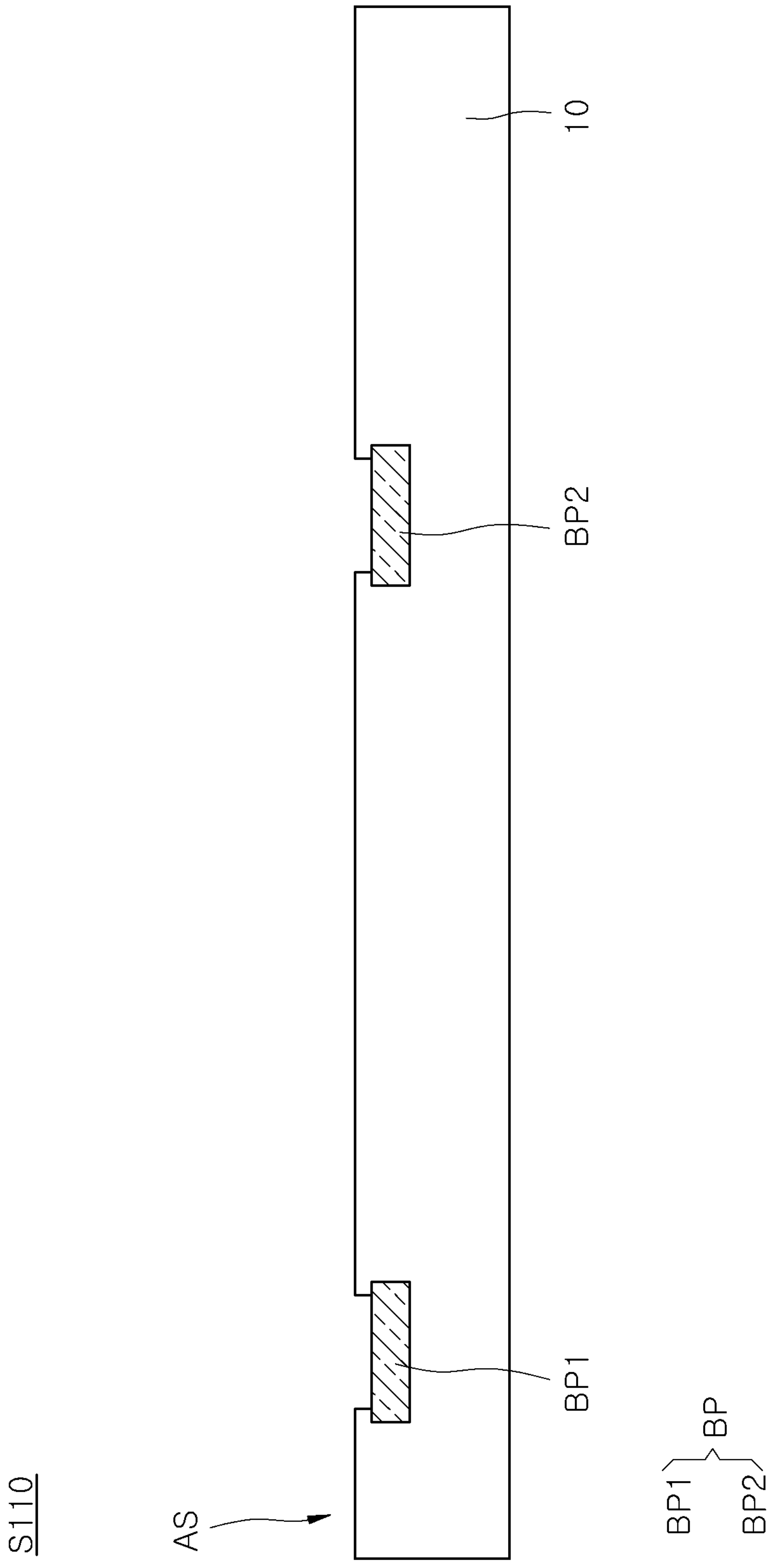
FIGS. 5A to 5J are cross-sectional views illustrating each operation of a method of manufacturing a semiconductor device according to a second exemplary embodiment of the present invention.

Referring to FIG. 5A, first, a semiconductor chip 10 in a wafer state is provided (S110). In the semiconductor chip 10, first and second bonding pads BP1 and BP2 which are paths for power supply and electrical input and output of a circuit are formed to be exposed on the side of an active surface AS of the semiconductor chip 10 through pad openings.

Figure 5B:
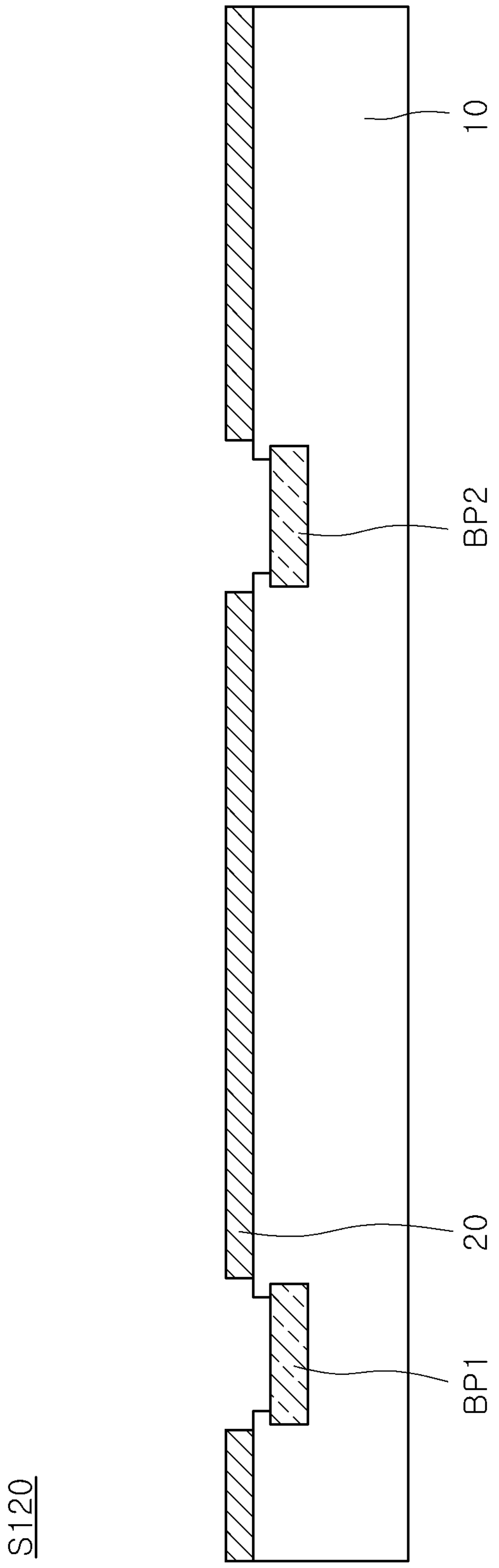

Subsequently, as shown in FIG. 5B, a first passivation layer 20 is formed on the semiconductor chip 10 to expose the bonding pads BP (S120). In the operation S120, the first passivation layer 20 is formed on the semiconductor chip 10 to expose the first and second bonding pads BP1 and BP2 on the side of the active surface AS of the semiconductor chip 10.

Figure 5C:
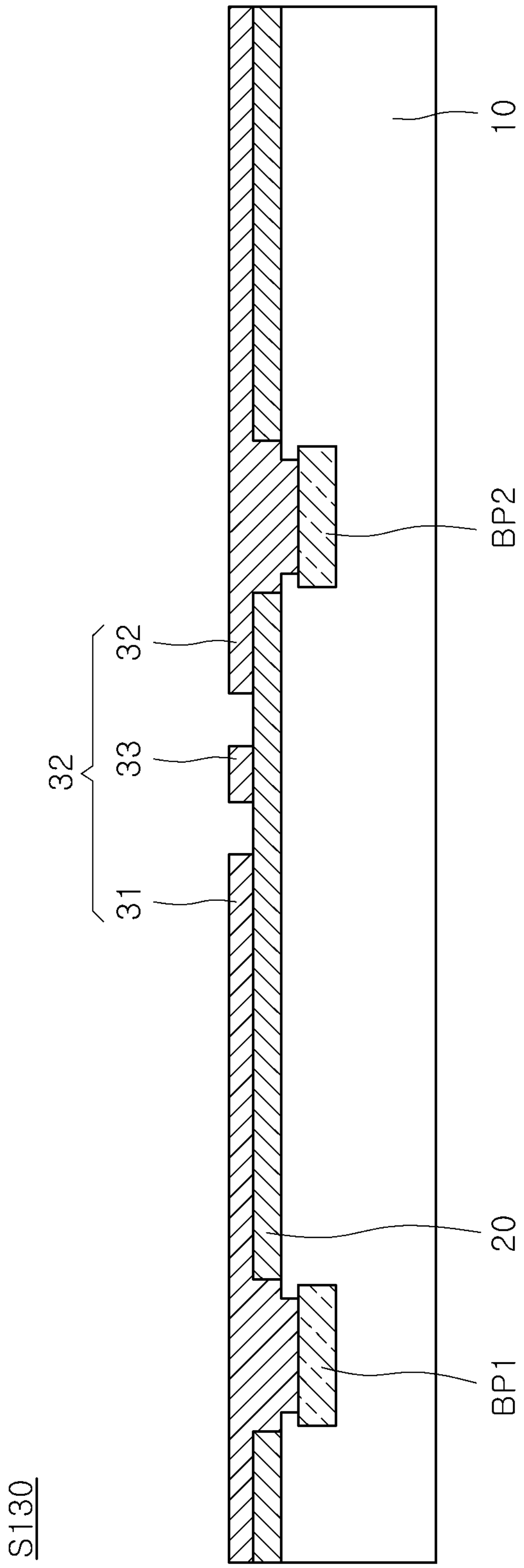

Subsequently, as shown in FIG. 5C, a first re-distribution layer 30 is formed to be connected to the bonding pads BP and extend on the first passivation layer 20 (S130). A part of the first re-distribution layer 30 connected to the first bonding pad BP1 is defined as a first re-distribution line 31, and a part of the first re-distribution layer 30 connected to the second bonding pad BP2 is defined as a second re-distribution line 32. Also, as shown in FIG. 5C, an additional re-distribution line 33 for rearranging an additional bonding pad (not shown) may be formed in the operation S130.

Figure 5D:
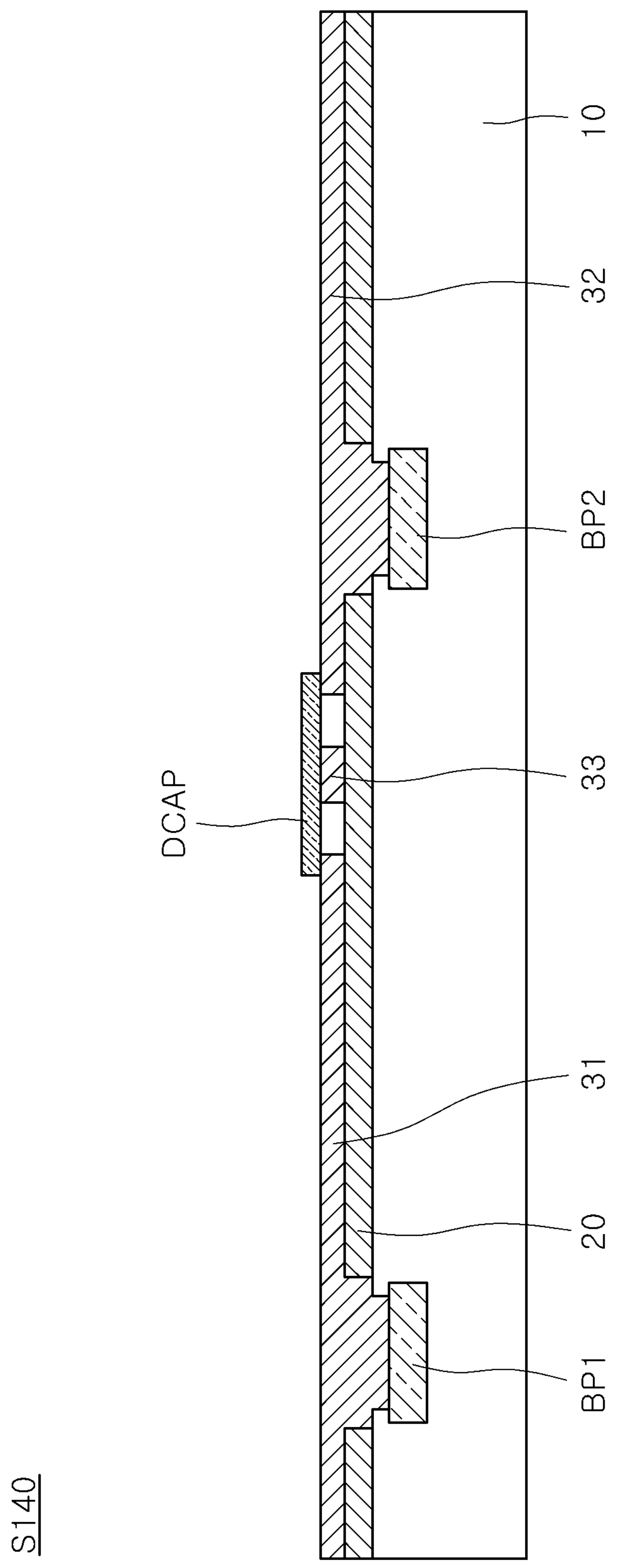

Subsequently, as shown in FIG. 5D, the capacitor DCAP is formed to be electrically connected to the first re-distribution layer 30 at a wafer level (S140). In the operation S140, the capacitor DCAP may be formed in contact with the first re-distribution layer 30 through a surface mount (SMT) process. Accordingly, first and second power input pads of the capacitor DCAP are formed in contact with the first and second re-distribution lines 31 and 32, respectively. When the capacitor DCAP has an additional power input pad, the additional power input pad of the capacitor DCAP may be formed in contact with the additional re-distribution line 33 described above. In this way, the first and second re-distribution lines 31 and 32 and the additional re-distribution line 33 are configured to function as multi-nodes of the capacitor DCAP.

Figure 5E:
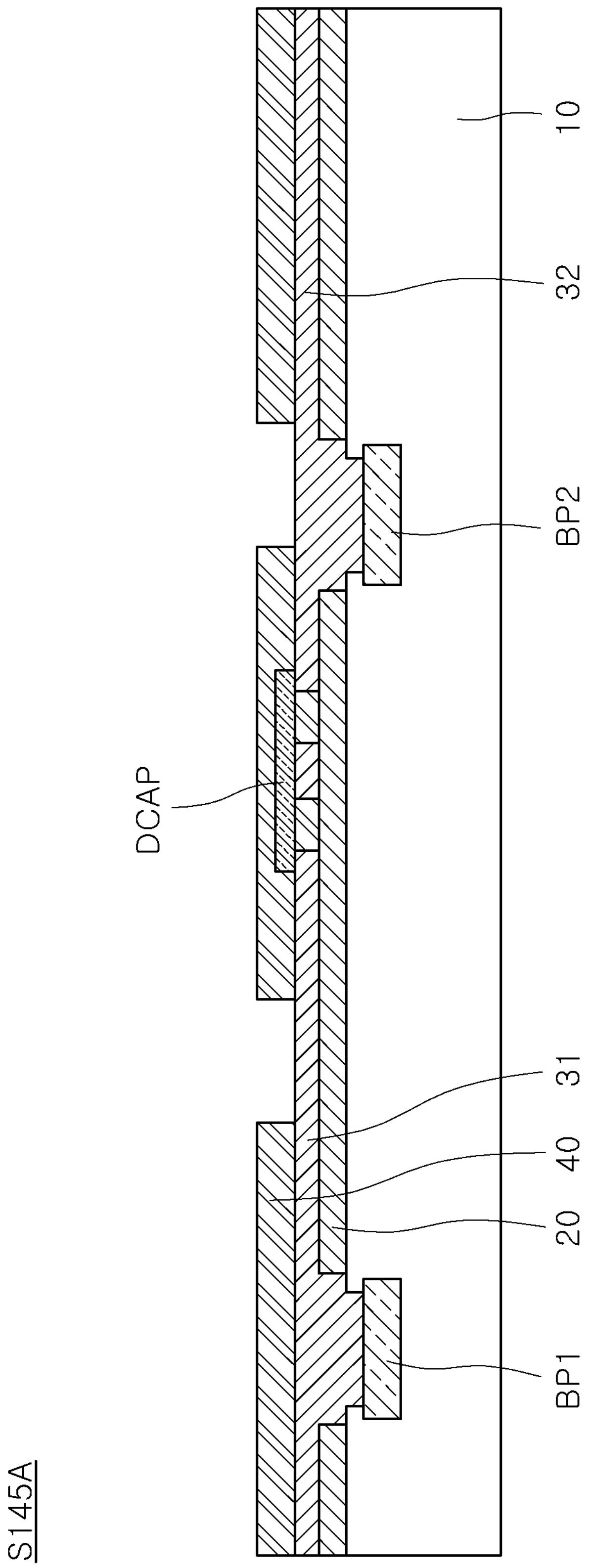

Subsequently, as shown in FIG. 5E, a second passivation layer 40 is formed on the first passivation layer 20 and the first re-distribution layer 30 (S145A). In the operation S145A, the second passivation layer 40 is formed to cover the first passivation layer 20, the first re-distribution layer 30, and the capacitor DCAP, the entire region other than a region in which a second re-distribution layer 50 to be described below will be formed is coated with photoresist, and then the photoresist is exposed and developed to expose at least a part of the first re-distribution layer 30 on the side of the active surface AS of the semiconductor chip 10.

Figure 5F:
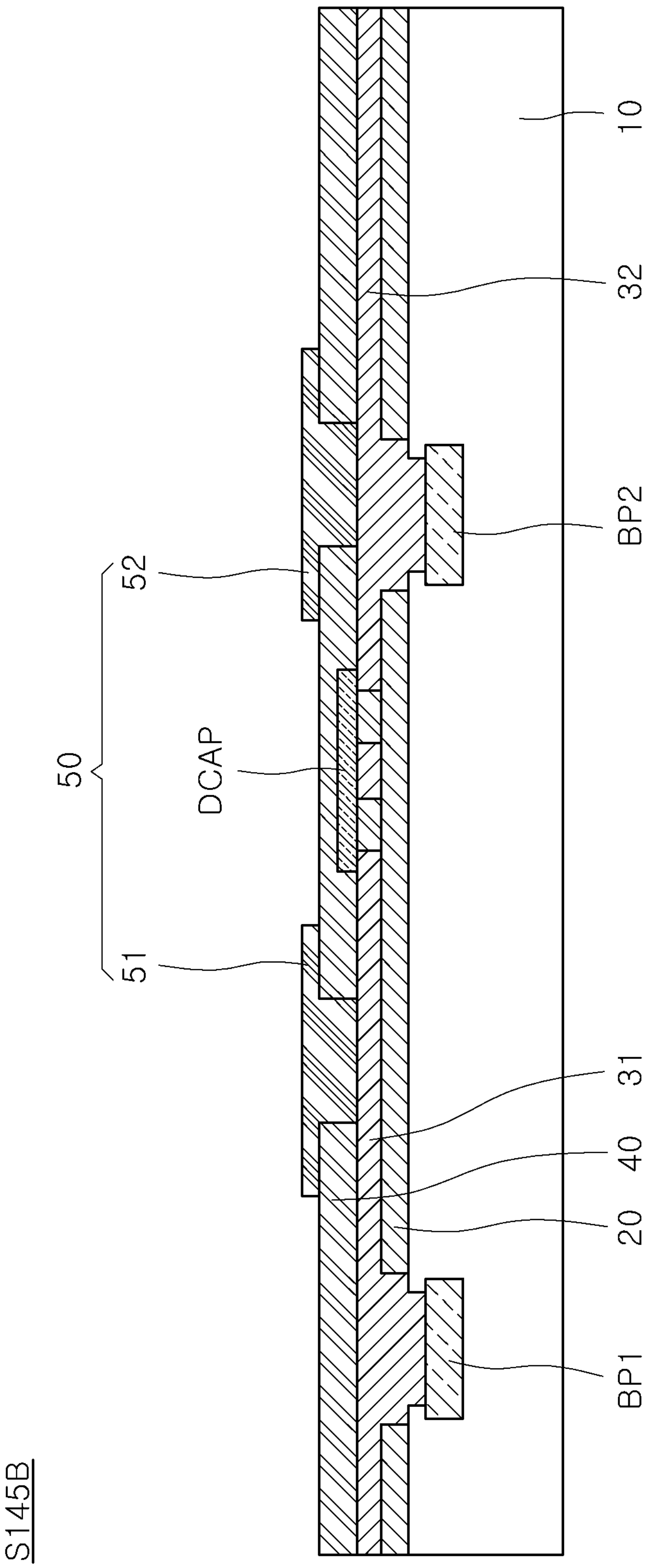

Subsequently, as shown in FIG. 5F, the second re-distribution layer 50 is formed in the region in which the first re-distribution layer 30 is exposed through the second passivation layer 40 (S145B). A part of the second re-distribution layer 50 connected to the first re-distribution line 31 is defined as a third re-distribution line 51, and a part of the second re-distribution layer 50 connected to the second re-distribution line 32 is defined as a fourth re-distribution line 52. As shown in FIG. 5F, the third and fourth re-distribution lines 51 and 52 may have a part extending on the second passivation layer 40.

Figure 5G:
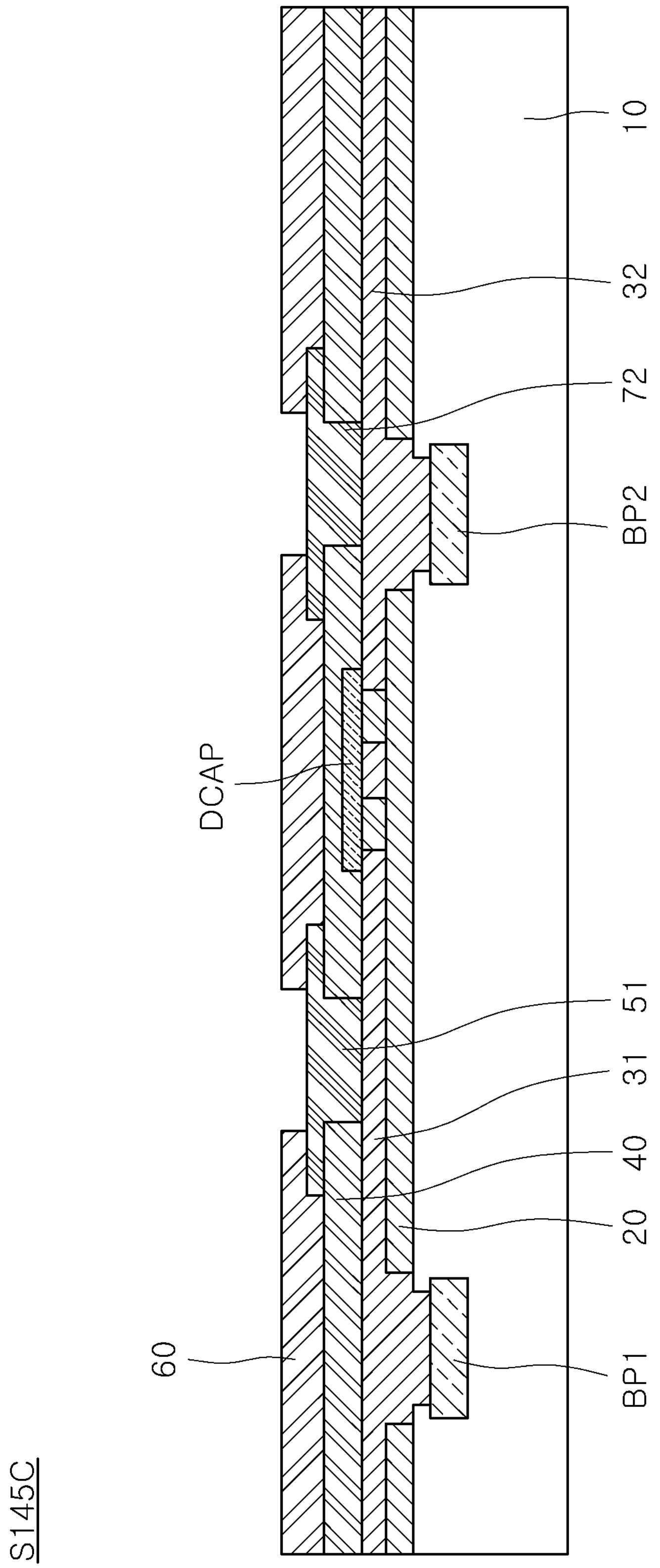

Subsequently, as shown in FIG. 5G, a third re-distribution layer 60 is formed on the second passivation layer 40 and the second re-distribution layer 50 to expose at least a part of the second re-distribution layer 50 (S145C). In the operation S145C, the third passivation layer 60 is formed to cover the second passivation layer 40 and the second re-distribution layer 50, the entire region other than a region in which a conductive member 70 to be described below will be formed is coated with photoresist, and then the photoresist is exposed and developed to expose at least a part of the second re-distribution layer 50 on the side of the active surface AS of the semiconductor chip 10.

Figure 5H:
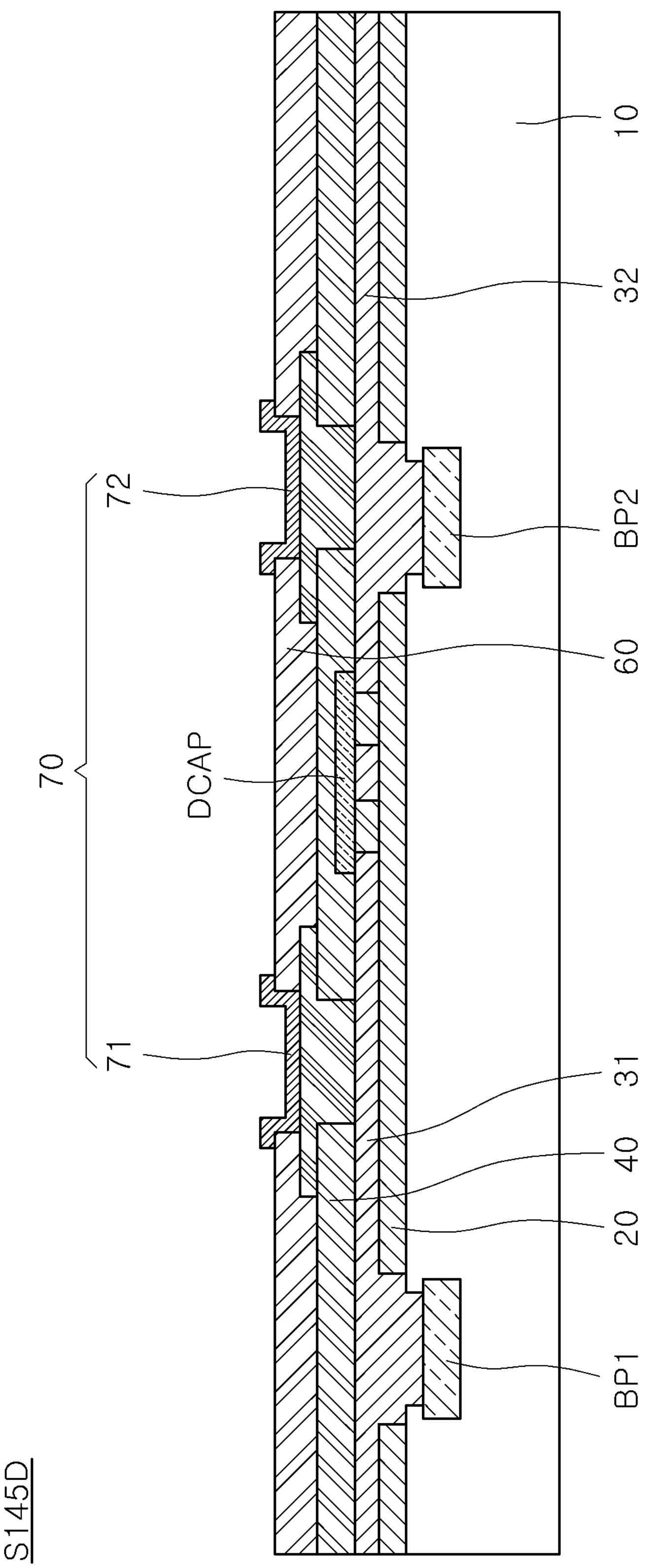

Subsequently, as shown in FIG. 5H, the conductive member 70 is formed through a plating process in the region in which the second re-distribution layer 50 is exposed through the third passivation layer 60 (S145B). The conductive member 70 may be a UBM provided to facilitate welding of a conductive bump B to be described below. To clearly distinguish terms, a conductive member on which a first conductive bump B1 is formed is defined as a first conductive member 71, and a conductive member on which a second conductive bump B2 is formed is defined as a second conductive member 72.

Figure 5I:
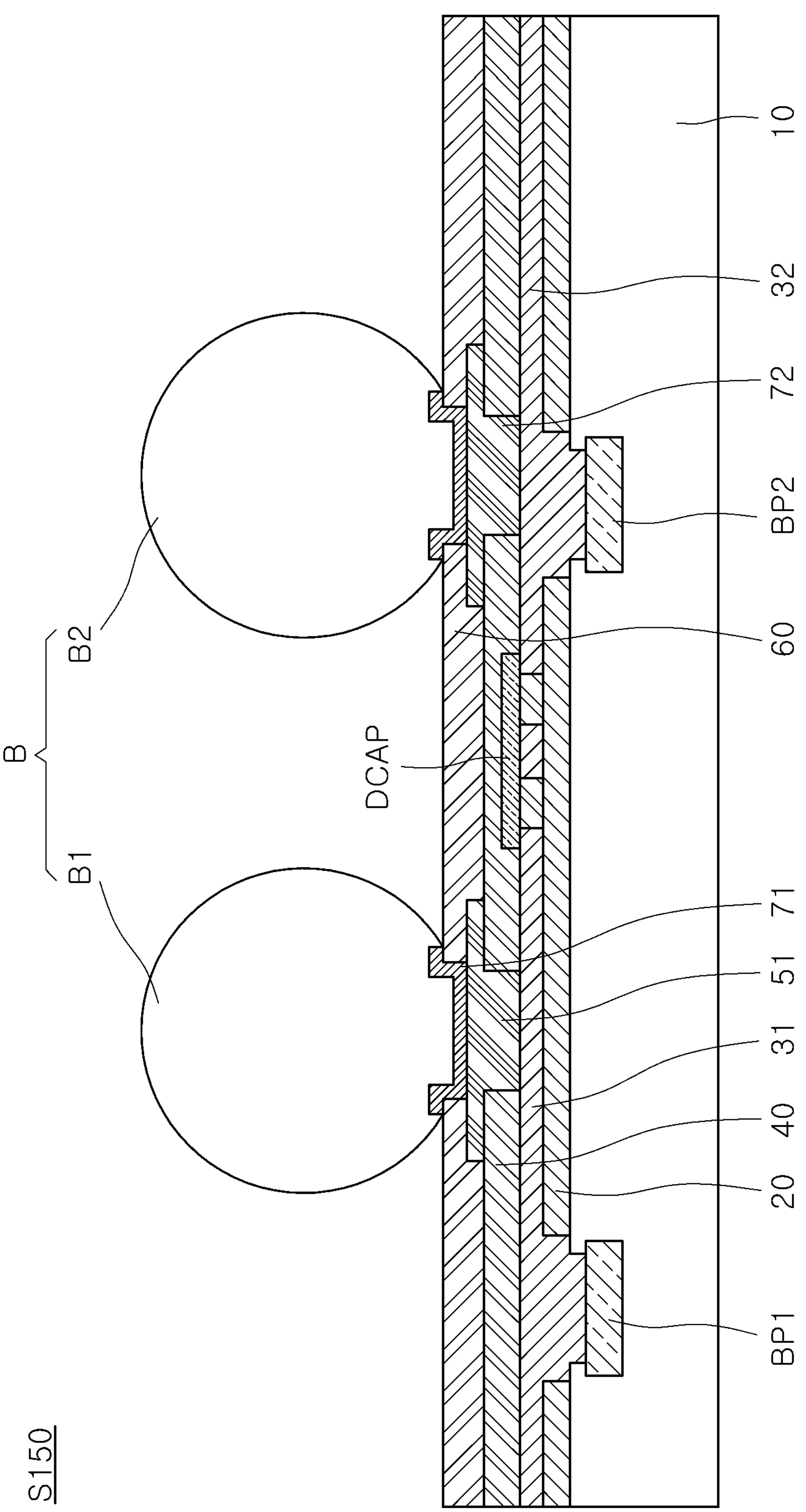
Figure 5J:
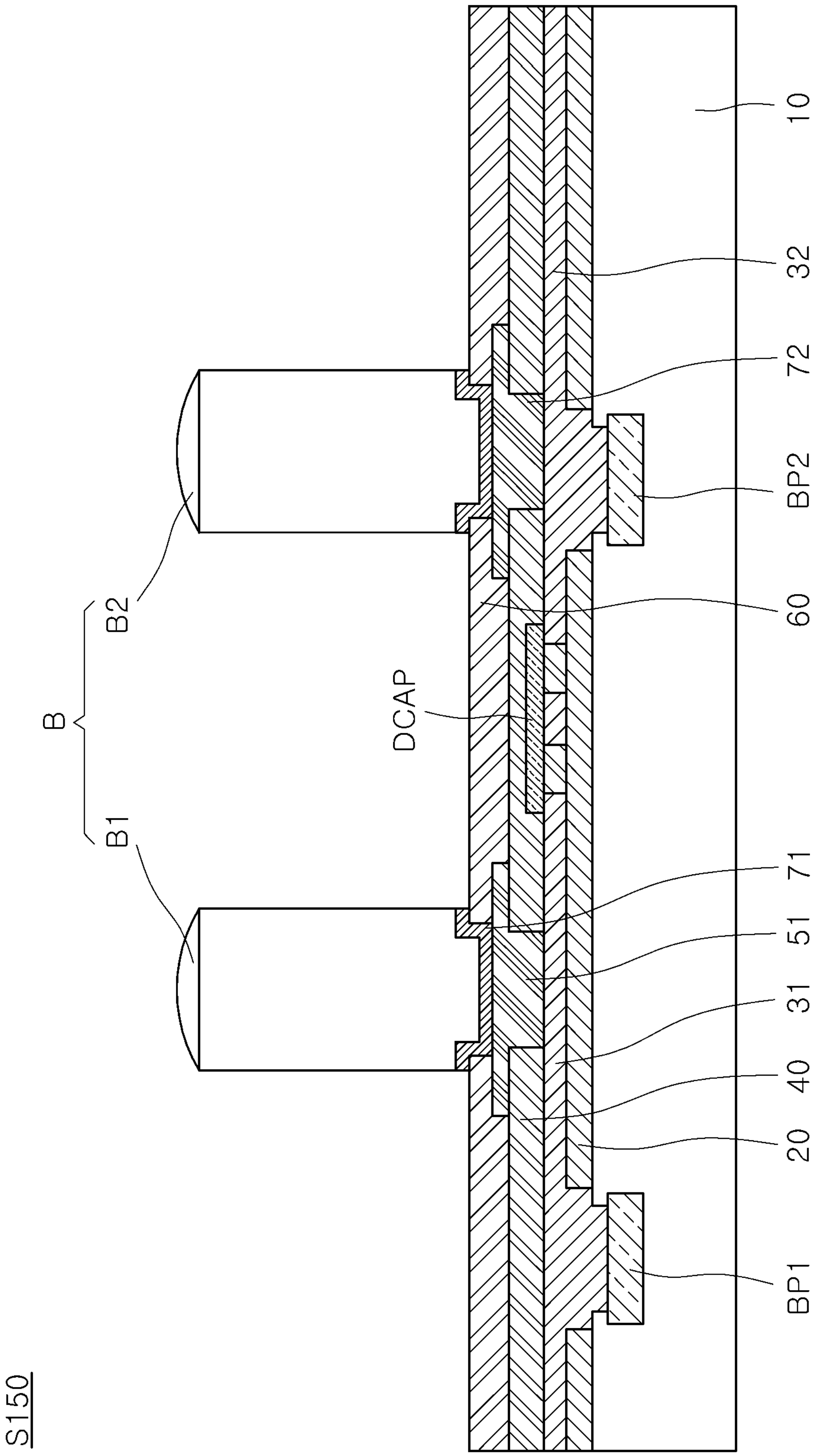

Subsequently, as shown in FIG. 5I, a conductive bump B is formed on an electrical signal path leading to the bonding pads BP, the first re-distribution layer 30, and the PCB substrate (not shown) (S150). When an electrical signal path leading to the first bonding pad BP1, the first re-distribution line 31, the third re-distribution line 51, the first conductive member 71, and the PCB substrate is defined as a first electrical signal path and an electrical signal path leading to the second bonding pad BP2, the second re-distribution line 32, the fourth re-distribution line 52, the second conductive member 72, and the PCB substrate is defined as a second electrical signal path, the conductive bump B may include a first conductive bump B1 disposed on the first electrical signal path and a second conductive bump B2 disposed on the second electrical signal path. Accordingly, in the operation S150, the first and second conductive bumps B1 and B2 are mounted on the semiconductor chip 10 to bring the first conductive bump B1 into contact with the first conductive member 71 electrically connected to the first and third re-distribution lines 31 and 51 and bring the second conductive bump B2 into contact with the second conductive member 72 electrically connected to the second and fourth re-distribution lines 32 and 52, and then a reflow process is performed to weld the first and second conductive bumps B1 and B2 to the first and second conductive members 71 and 72, respectively. Although FIG. 5I shows an example in which the conductive bump B is implemented as a solder bump, the conductive bump B may be implemented as a copper pillar bump as shown in FIG. 5J according to an embodiment.

A WLP (particularly, a fan-in WLP) can be manufactured through the operations S110 to S150. In particular, the capacitor DCAP is electrically connected to the first electrical signal path (e.g., a VCC power input path) and the second electrical signal path (e.g., a ground path) through the first and second re-distribution layers 30 and 50 to lower the impedance of the first and second electrical signal paths. Accordingly, it is possible to obtain an improved impedance characteristic and power noise reduction characteristic. Further, since the capacitor DCAP is disposed between the first passivation layer 20 and the third passivation layer 60 (i.e., the capacitor DCAP is disposed in a passivation layer), the capacitor DCAP is not affected by a disturbance, and low equivalent serial resistance (ESR) and equivalent serial inductance (ESL) characteristics can be maintained.

Meanwhile, after the operation S150, an operation S160 of dicing the semiconductor chip 10 in the wafer state into a plurality of CSPs may be additionally performed.

3. Third Exemplary Embodiment

FIGS. 6A to 6J are cross-sectional views illustrating each operation of a method of manufacturing a semiconductor device according to a third exemplary embodiment of the present invention.

As described above in the second exemplary embodiment, during a process of manufacturing a WLP, a plurality of re-distribution layers may be required for rearranging pads in accordance with the number of pads and the total layout area of a semiconductor chip 10. In this case, a capacitor DCAP may be disposed in a passivation layer like in the second exemplary embodiment. However, with an increase in the complexity of a re-distribution layer, a space for accommodating the capacitor DCAP may not be formed in the passivation layer. The third exemplary embodiment focuses on a structure in which a capacitor DCAP is formed outside a passivation layer and a process of forming the capacitor DCAP outside the passivation layer when a WLP is configured to include a plurality of re-distribution layers. Detailed description of the same structure and process as those of the first and second exemplary embodiments will be omitted, and a different structure and process from the first and second exemplary embodiments will be described. The same process and structure as those of the first and second exemplary embodiments will be indicated by the same reference numerals as those of the first and second exemplary embodiments.

Figure 6A:
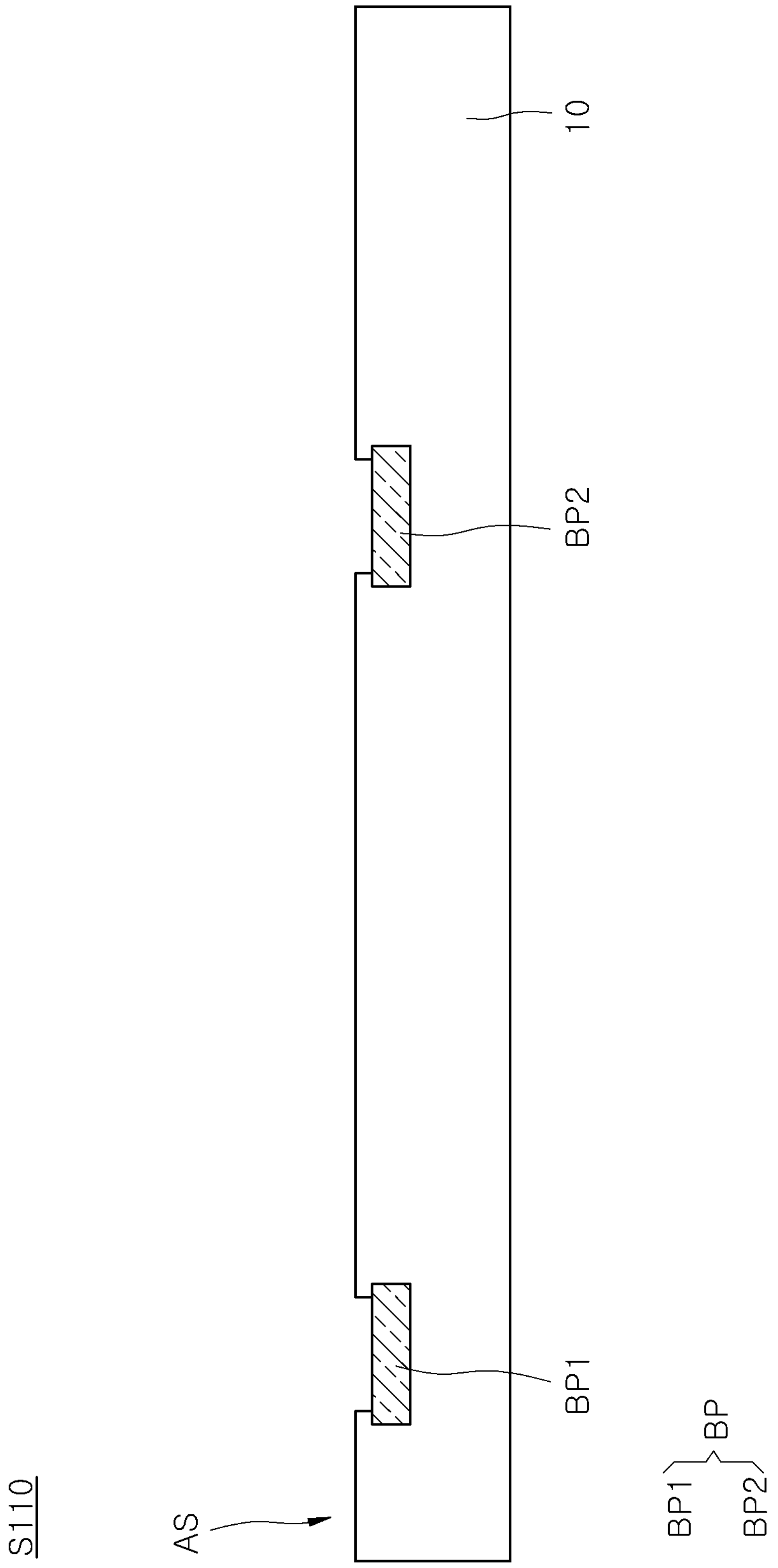
FIGS. 6A to 6J are cross-sectional views illustrating each operation of a method of manufacturing a semiconductor device according to a third exemplary embodiment of the present invention.

Referring to FIG. 6A, first, a semiconductor chip 10 in a wafer state is provided (S110). In the semiconductor chip 10, first and second bonding pads BP1 and BP2 which are paths for power supply and electrical input and output of a circuit are formed to be exposed on the side of an active surface AS of the semiconductor chip 10 through pad openings.

Figure 6B:
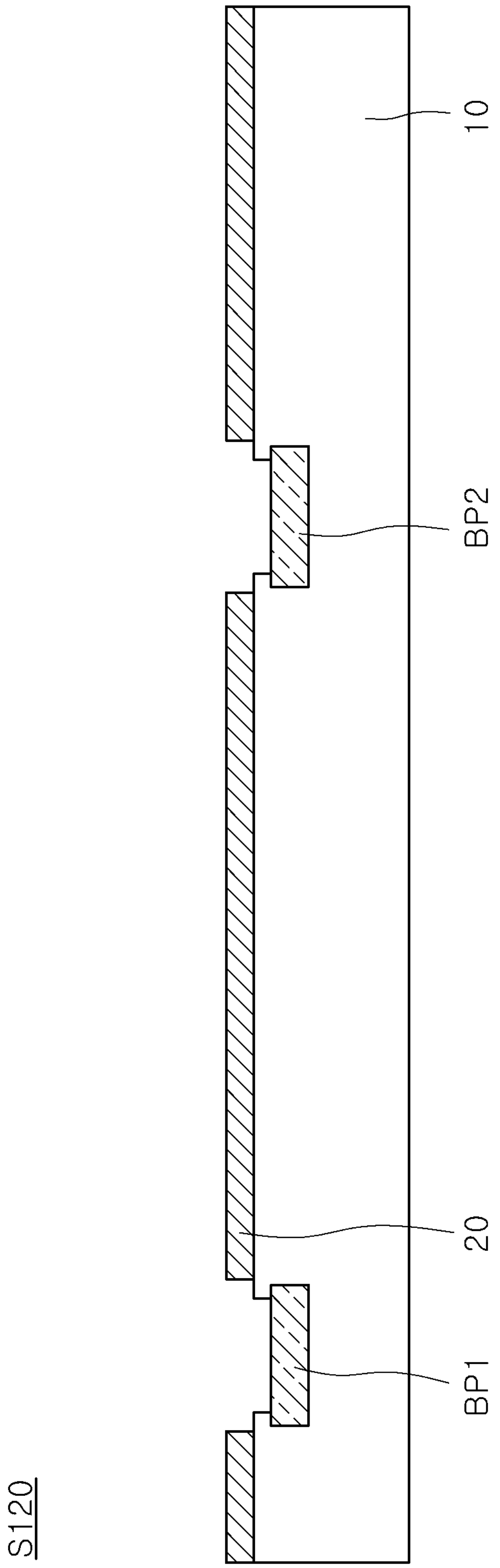

Subsequently, as shown in FIG. 6B, a first passivation layer 20 is formed on the semiconductor chip 10 to expose the bonding pads BP (S120). In the operation S120, the first passivation layer 20 is formed on the semiconductor chip 10 to expose the first and second bonding pads BP1 and BP2 on the side of the active surface AS of the semiconductor chip 10.

Figure 6C:
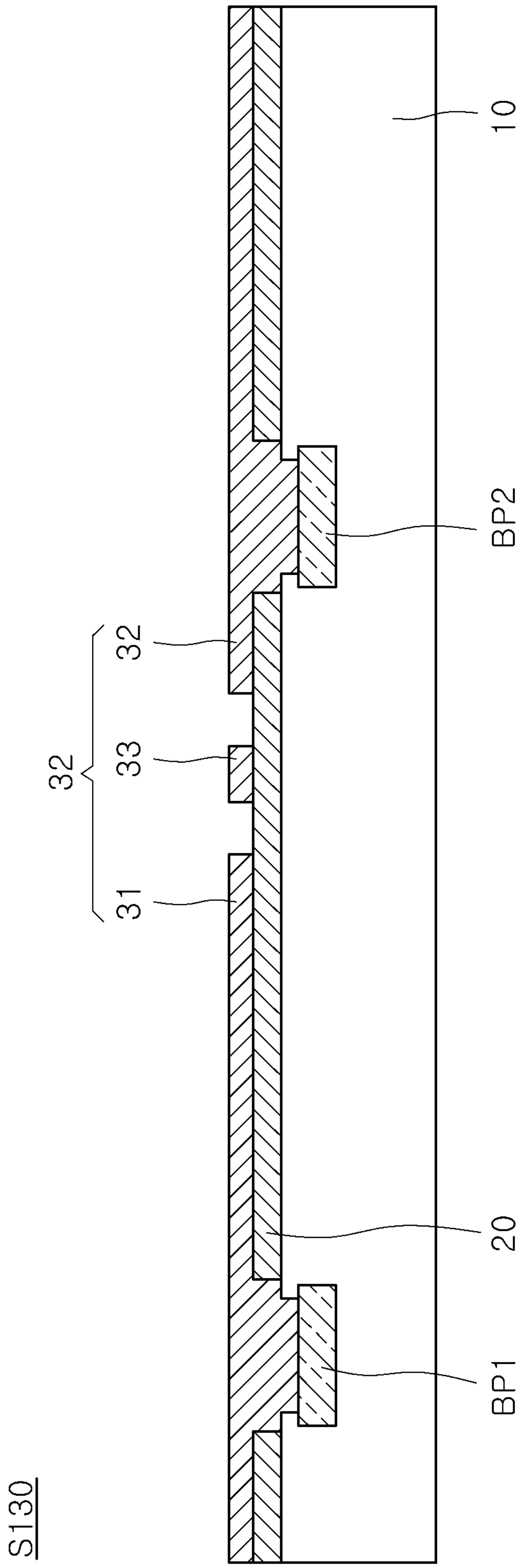

Subsequently, as shown in FIG. 6C, a first re-distribution layer 30 is formed to be connected to the bonding pads BP and extend on the first passivation layer 20 (S130). A part of the first re-distribution layer 30 connected to the first bonding pad BP1 is defined as a first re-distribution line 31, and a part of the first re-distribution layer 30 connected to the second bonding pad BP2 is defined as a second re-distribution line 32. Also, as shown in FIG. 6C, an additional re-distribution line 33 for rearranging an additional bonding pad (not shown) may be formed in the operation S130.

Figure 6D:
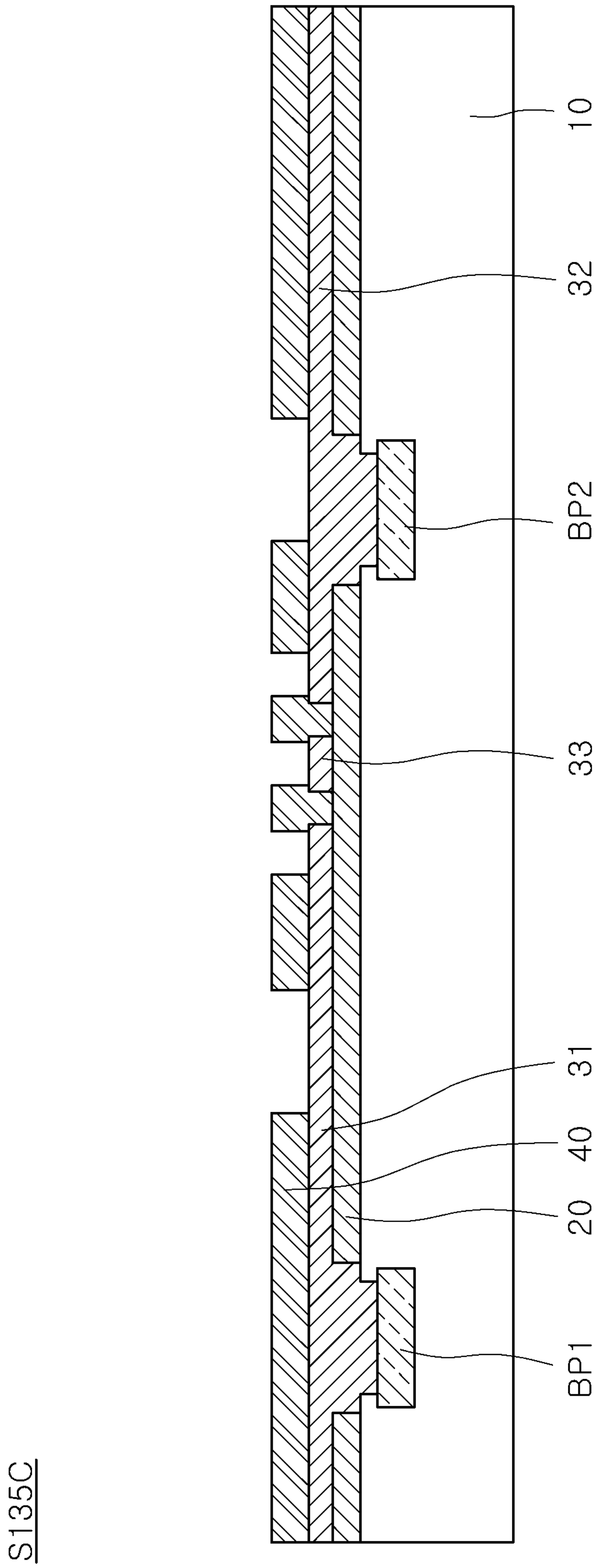

Subsequently, as shown in FIG. 6D, a second passivation layer 40 is formed on the first passivation layer 20 and the first re-distribution layer 30 to expose at least a part of the first re-distribution layer 30 (S135C). In the operation S135C, the second passivation layer 40 is formed to cover the first passivation layer 20 and the first re-distribution layer 30, the entire region other than a region in which a second re-distribution layer 50 to be described below will be formed is coated with photoresist, and then the photoresist is exposed and developed to expose at least a part of the first re-distribution layer 30 on the side of the active surface AS of the semiconductor chip 10.

Figure 6E:
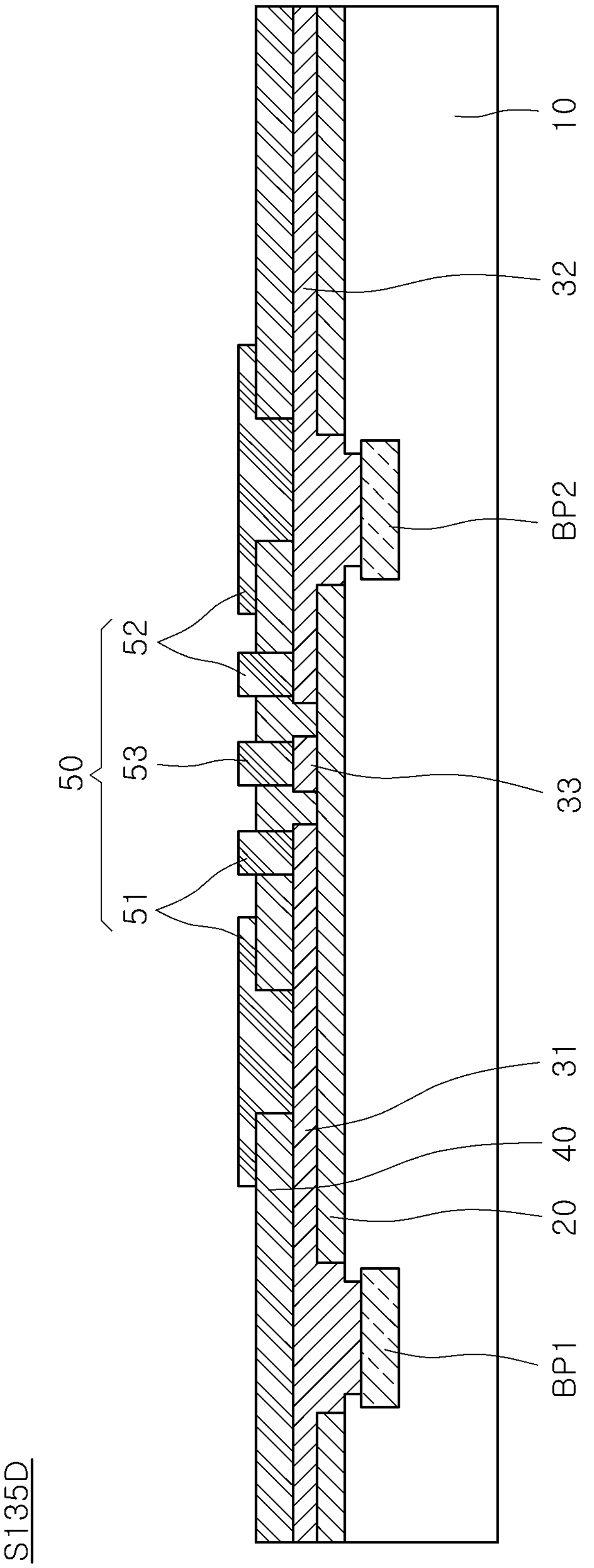

Subsequently, as shown in FIG. 6E, the second re-distribution layer 50 is formed in the region in which the first re-distribution layer 30 is exposed through the second passivation layer 40 (S135D). A part of the second re-distribution layer 50 connected to the first re-distribution line 31 is defined as a third re-distribution line 51, and a part of the second re-distribution layer 50 connected to the second re-distribution line 32 is defined as a fourth re-distribution line 52. As shown in FIG. 6E, the third and fourth re-distribution lines 51 and 52 may have a part extending on the second passivation layer 40. Also, as shown in FIG. 6E, an additional re-distribution line 53 for rearranging an additional bonding pad (not shown) may be formed on the additional re-distribution line 33 in the operation S135D (to clearly distinguish between the additional re-distribution lines 33 and 53, the additional re-distribution line 33 included in the first re-distribution layer 30 may be displayed as a first additional re-distribution line 33, and the additional re-distribution line 53 included in the second re-distribution layer 50 may be displayed as a second additional re-distribution line 53).

Figure 6F:
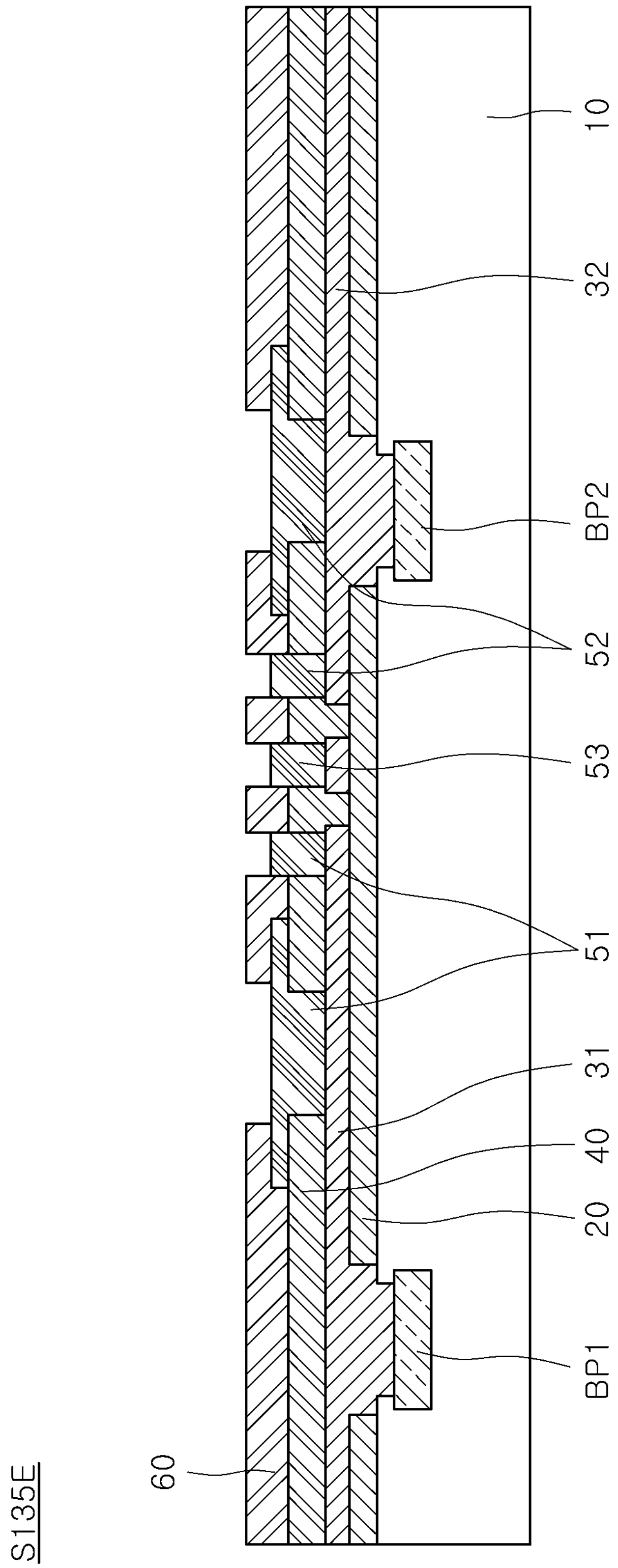

Subsequently, as shown in FIG. 6F, a third passivation layer 60 is formed on the second passivation layer 40 and the second re-distribution layer 50 to expose at least a part of the second re-distribution layer 50 (S135E). In the operation S135E, the third passivation layer 60 is formed to cover the second passivation layer 40 and the second re-distribution layer 50, the entire region other than a region in which a conductive member 70 to be described below will be formed is coated with photoresist, and then the photoresist is exposed and developed to expose at least a part of the second re-distribution layer 50 on the side of the active surface AS of the semiconductor chip 10.

Figure 6G:
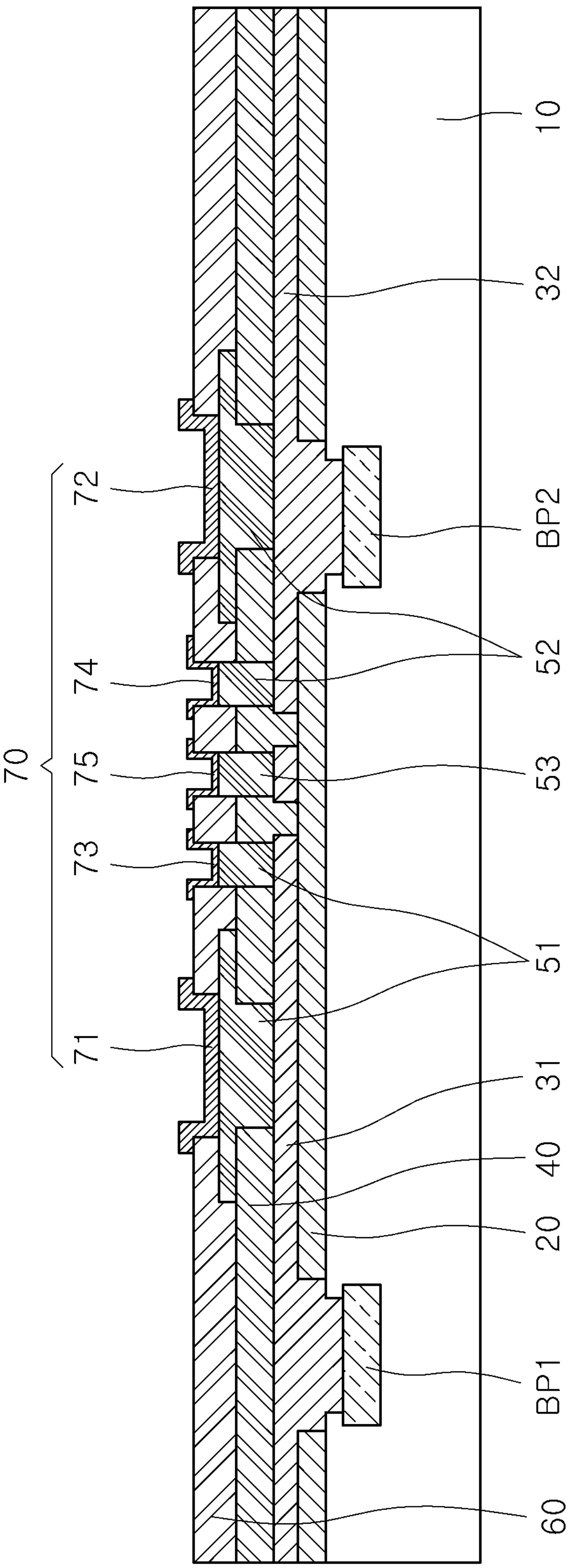

Subsequently, as shown in FIG. 6G, the conductive member 70 is formed through a plating process in the region in which the second re-distribution layer 50 is exposed through the third passivation layer 60 (S135F). The conductive member 70 may be a UBM provided to facilitate welding of a conductive bump B to be described below. To clearly distinguish terms, a conductive member on which a first conductive bump B1 is formed is defined as a first conductive member 71, a conductive member on which a second conductive bump B2 is formed is defined as a second conductive member 72, a conductive member to which a first power input pad of a capacitor DCAP to be described below is connected is defined as a third conductive member 73, and a conductive member to which a second power input pad of the capacitor DCAP is connected is defined as a fourth conductive member 74. The first conductive member 71 and the third conductive member 73 are electrically connected through the first re-distribution line 31, and the second conductive member 72 and the fourth conductive member 74 are electrically connected through the second re-distribution line 32. When the capacitor DCAP has an additional power input pad, an additional conductive member 75 to which the additional power input pad of the capacitor DCAP will be welded may be formed on the second additional re-distribution line 53.

Figure 6H:
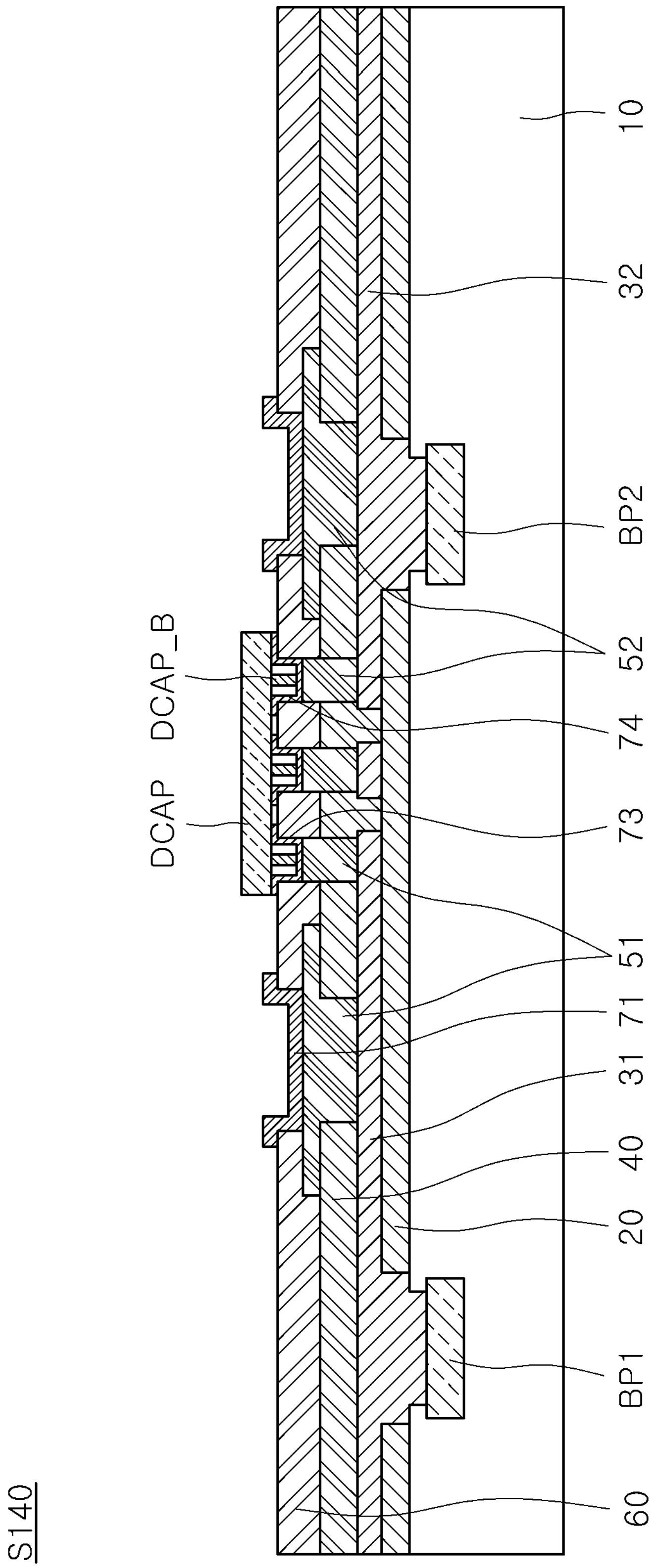

Subsequently, as shown in FIG. 6H, the capacitor DCAP is formed to be electrically connected to the first re-distribution layer 30 at a wafer level (S140). In the operation S140, the capacitor DCAP is mounted on the semiconductor chip 10 to bring a solder cap of a bump DCAP_B formed on the first power input pad of the capacitor DCAP into contact with the third conductive member 73 electrically connected to the first and third re-distribution lines 31 and 51 and bring a solder cap of a bump DCAP_B formed on the second power input pad of the capacitor DCAP into contact with the fourth conductive member 74 electrically connected to the second and fourth re-distribution lines 32 and 52, and then a reflow process is performed to weld the capacitor DCAP to the third and fourth conductive members 73 and 74. When the capacitor DCAP has an additional power input pad, the additional power input pad of the capacitor DCAP may be formed in contact with the additional conductive member 75 described above. In this way, the first and second re-distribution lines 31 and 32 are configured to function as multi-nodes of the capacitor DCAP.

Figure 6I:
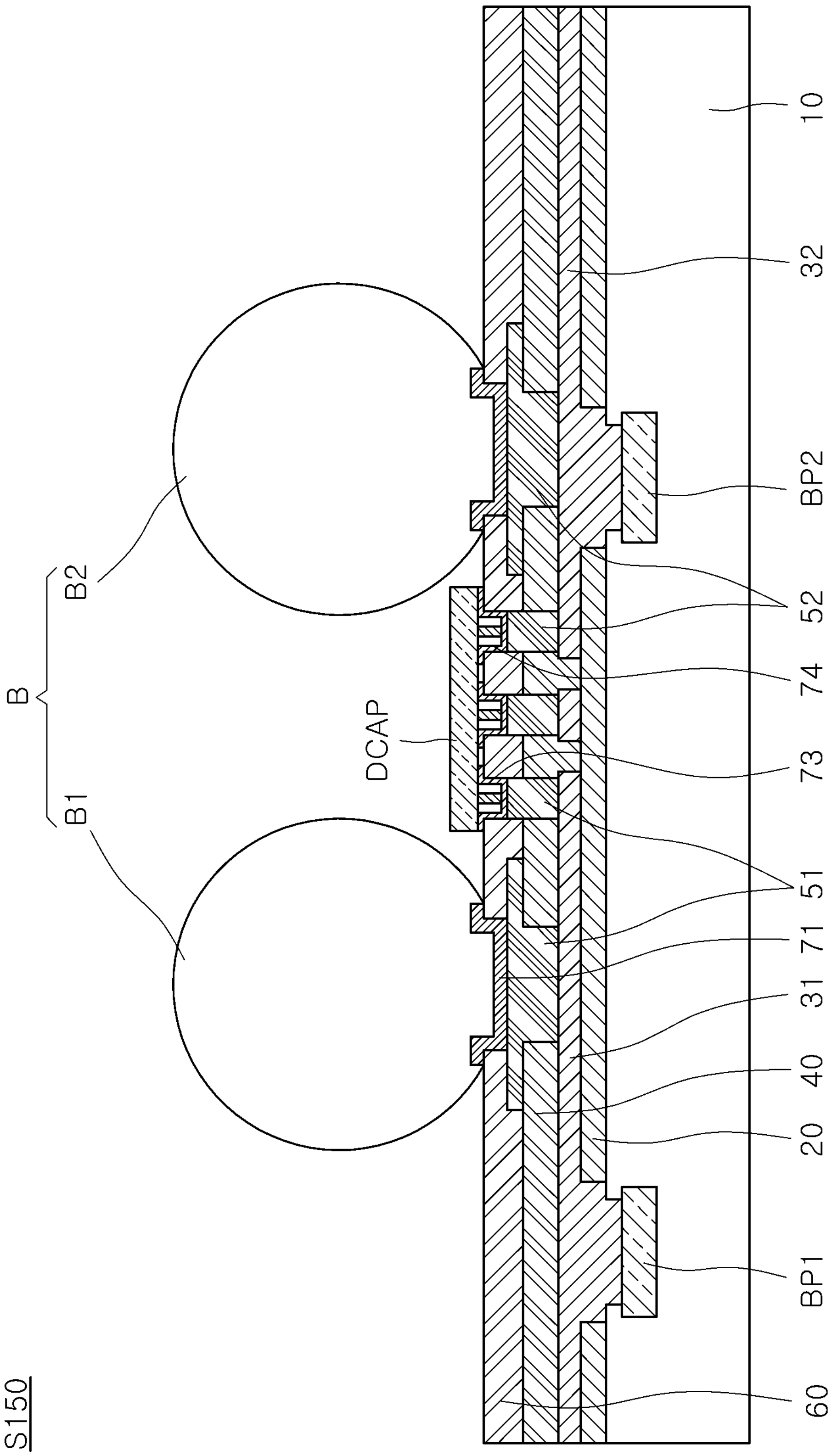
Figure 6J:
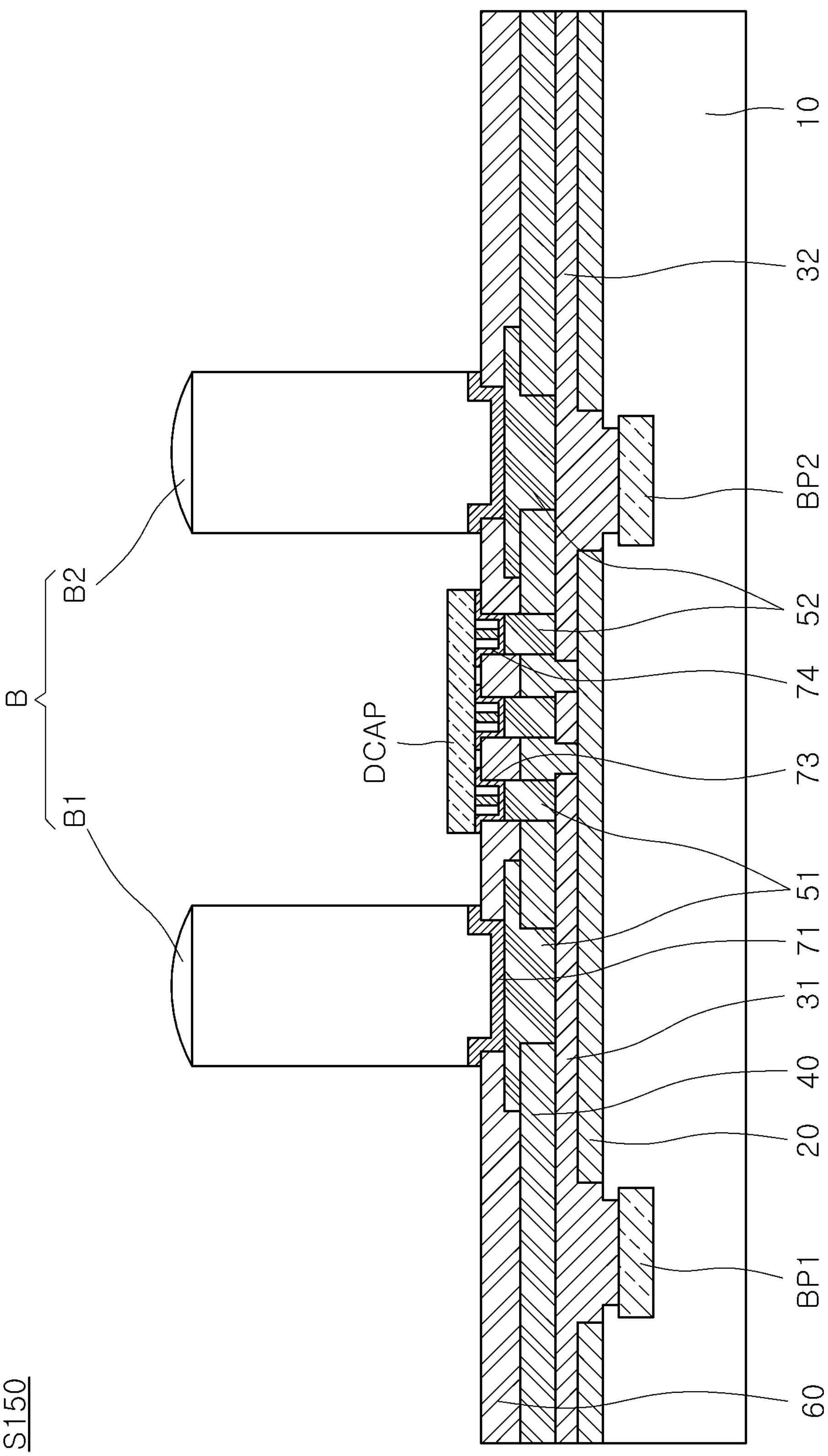

Subsequently, as shown in FIG. 6I, a conductive bump B is formed on an electrical signal path leading to the bonding pads BP, the first re-distribution layer 30, and the PCB substrate (not shown) to which the packaged semiconductor chip 10 (i.e., a WLP) will be attached (S150). When an electrical signal path leading to the first bonding pad BP1, the first re-distribution line 31, the third re-distribution line 51, the first conductive member 71, and the PCB substrate is defined as a first electrical signal path and an electrical signal path leading to the second bonding pad BP2, the second re-distribution line 32, the fourth re-distribution line 52, the second conductive member 72, and the PCB substrate is defined as a second electrical signal path, the conductive bump B may include a first conductive bump B1 disposed on the first electrical signal path and a second conductive bump B2 disposed on the second electrical signal path. Accordingly, in the operation S150, the first and second conductive bumps B1 and B2 are mounted on the semiconductor chip 10 to bring the first conductive bump B1 into contact with the first conductive member 71 electrically connected to the first and third re-distribution lines 31 and 51 and bring the second conductive bump B2 into contact with the second conductive member 72 electrically connected to the second and fourth re-distribution lines 32 and 52, and then a reflow process is performed to weld the first and second conductive bumps B1 and B2 to the first and second conductive members 71 and 72, respectively. Although FIG. 6I shows an example in which the conductive bump B is implemented as a solder bump, the conductive bump B may be implemented as a copper pillar bump as shown in FIG. 6J according to an embodiment.

A WLP (particularly, a fan-in WLP) can be manufactured through the operations S110 to S150. After the operation S150, an operation S160 of dicing the semiconductor chip 10 in the wafer state into a plurality of CSPs may be additionally performed.

Figure 7A:
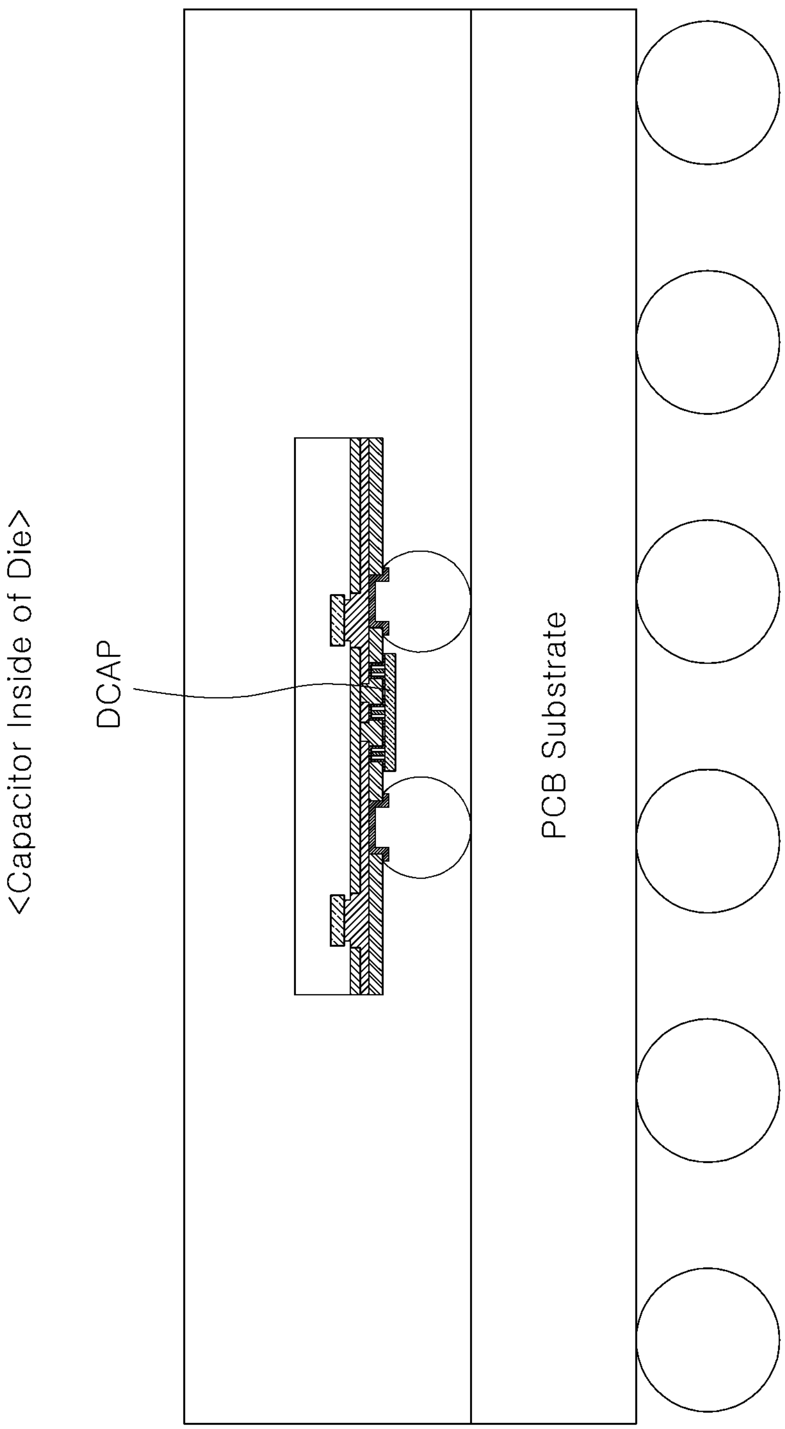
FIGS. 7A and 7B are diagrams illustrating structures of semiconductor devices in which a capacitor is disposed according to the present invention.
Figure 7B:
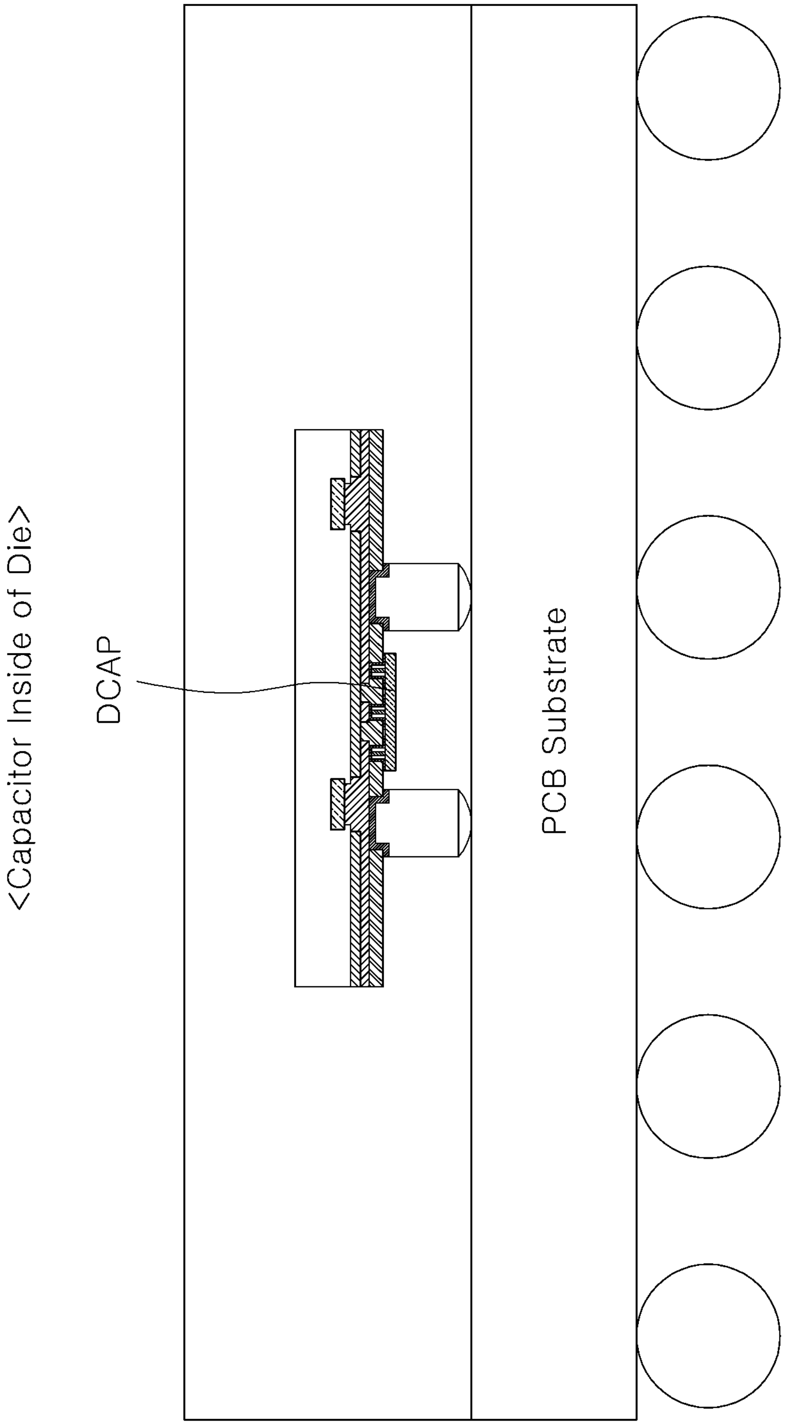

FIGS. 7A and 7B are diagrams illustrating structures of semiconductor devices in which a capacitor is disposed according to the present invention. Compared to the capacitor layout structure according to the related art, the distance between a pad and a capacitor can be remarkably reduced because the capacitor is disposed in a die. Although only two conductive bumps are shown in FIG. 7 to facilitate understanding of the present invention, a semiconductor chip may be attached to a PCB substrate through two or more conductive bumps in an actual semiconductor device manufacturing process.

According to the present invention, a capacitor (e.g., a decoupling capacitor) is not formed on a PCB substrate and is formed to be electrically connected to a re-distribution layer at a wafer level, and thus the capacitor is included in a WLP package. Therefore, the distance between a pad and the capacitor (i.e., the length of a power delivery network (PDN), e.g., the length A of FIG. 1) can be remarkably reduced. Accordingly, it is possible to minimize an increase in the impedance of the PDN caused by influence of interconnections of a multi-layer PCB substrate and influence of the resistance of the PDN. Consequently, it is possible to obtain an improved impedance characteristic and power noise reduction characteristic compared to those of a semiconductor device according to the related art.

According to the present invention, no capacitor is formed in a PCB substrate, and thus a PCB substrate area that can be used in an SMT process can be increased.

According to the present invention, a capacitor is directly applied to input and output pads of a WLP. Therefore, while power noise is reduced, input and output signals can be stabilized.

According to the present invention, the number of capacitors required for lowering impedance is reduced by using a re-distribution layer of a WLP as multi-nodes of a capacitor. Therefore, a cost for implementing a semiconductor device can be reduced.

Although the present invention has been described above with reference to embodiments shown in the drawings, the embodiments are merely illustrative, and it will be understood by those skilled in the technical field to which the present invention pertains that various modifications and other embodiments equivalent to the embodiments can be made from the embodiments. Therefore, the scope of the present invention should be determined on the basis of the following claims.

What is claimed is:

1. A semiconductor device comprising:

a semiconductor chip in which a bonding pad is formed in a wafer state;

a first passivation layer formed on the semiconductor chip to expose the bonding pad;

a first re-distribution layer connected to the bonding pad and extending on the first passivation layer;

a conductive bump disposed on an electrical signal path leading to the bonding pad, the first re-distribution layer, and a substrate; and a capacitor formed to be electrically connected to the first re-distribution layer at a wafer level before the conductive bump is formed, wherein the bonding pad includes first and second bonding pads, the first passivation layer is formed on the semiconductor chip to expose the first and second bonding pads, the first re-distribution layer includes first and second re-distribution lines which are respectively connected to the first and second bonding pads and extend on the first passivation layer;

the conductive bump includes a first conductive bump disposed on a first electrical signal path leading to the first bonding pad, the first re-distribution line, and the substrate and a second conductive bump disposed on a second electrical signal path leading to the second bonding pad, the second re-distribution line, and the substrate, and the capacitor is electrically connected to the first and second re-distribution lines and disposed between the first and second conductive bumps, wherein the semiconductor device further comprises:

a second passivation layer formed on the first passivation layer and the first re-distribution layer to expose at least a part of the first re-distribution layer; and a conductive member formed in a region in which the first re-distribution layer is exposed through the second passivation layer, wherein the first and second conductive bumps and the capacitor are formed on and in contact with the conductive member.

2. A semiconductor device comprising:

a semiconductor chip in which a bonding pad is formed in a wafer state;

a first passivation layer formed on the semiconductor chip to expose the bonding pad;

a first re-distribution layer connected to the bonding pad and extending on the first passivation layer;

a conductive bump disposed on an electrical signal path leading to the bonding pad, the first re-distribution layer, and a substrate; and a capacitor formed to be electrically connected to the first re-distribution layer at a wafer level before the conductive bump is formed, wherein the bonding pad includes first and second bonding pads, the first passivation layer is formed on the semiconductor chip to expose the first and second bonding pads, the first re-distribution layer includes first and second re-distribution lines which are respectively connected to the first and second bonding pads and extend on the first passivation layer;

the conductive bump includes a first conductive bump disposed on a first electrical signal path leading to the first bonding pad, the first re-distribution line, and the substrate and a second conductive bump disposed on a second electrical signal path leading to the second bonding pad, the second re-distribution line, and the substrate, and the capacitor is electrically connected to the first and second re-distribution lines and disposed between the first and second conductive bumps, wherein the semiconductor device further comprises:

a second passivation layer formed on the first passivation layer and the first re-distribution layer to expose at least a part of the first re-distribution layer;

a second re-distribution layer formed in a region in which the first re-distribution layer is exposed through the second passivation layer;

a third passivation layer formed on the second passivation layer and the second re-distribution layer to expose at least a part of the second re-distribution layer; and a conductive member formed in a region in which the second re-distribution layer is exposed through the third passivation layer, wherein the first and second conductive bumps and the capacitor are formed on and in contact with the conductive member.

3. The semiconductor device of claim 1 or 2, wherein the first and second re-distribution lines function as multi-nodes of the capacitor, and the first re-distribution line or the second re-distribution line is formed to be electrically connected to an additional conductive bump in addition to the first conductive bump or the second conductive bump.

4. The semiconductor device of claim 1 or 2, wherein the conductive bump is implemented as a solder bump or a Cu pillar bump.

5. The semiconductor device of claim 1 or 2, wherein the semiconductor device is implemented as a wafer-level package (WLP) or a wafer-level chip-scale package (WLCSP).

* * * * *